(12) United States Patent
Ahn

(10) Patent No.: US 11,297,723 B2
(45) Date of Patent: Apr. 5, 2022

(54) DISPLAY DEVICE

(71) Applicant: Samsung Display Co., Ltd., Yongin-si (KR)

(72) Inventor: Sungsang Ahn, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/674,302

(22) Filed: Nov. 5, 2019

(65) Prior Publication Data

US 2020/0315036 A1    Oct. 1, 2020

(30) Foreign Application Priority Data

Mar. 29, 2019    (KR) .......................... 10-2019-0037275

(51) Int. Cl.
| | |
|---|---|
| *H05K 5/00* | (2006.01) |
| *H05K 5/02* | (2006.01) |
| *H01L 51/00* | (2006.01) |
| *H01L 27/32* | (2006.01) |

(52) U.S. Cl.
CPC ......... *H05K 5/0017* (2013.01); *H05K 5/0217* (2013.01); *H01L 27/3244* (2013.01); *H01L 51/0097* (2013.01); *H01L 2251/5338* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 8,711,566 B2 | 4/2014 | O'Brien | |
| 2006/0125973 A1* | 6/2006 | Akiyama | G09F 9/30 349/58 |
| 2019/0138058 A1* | 5/2019 | Kwon | G09G 3/22 |

FOREIGN PATENT DOCUMENTS

| | | |
|---|---|---|
| KR | 10-2014-0059274 A | 5/2014 |
| KR | 10-2017-0116551 A | 10/2017 |

\* cited by examiner

*Primary Examiner* — Jerry Wu
(74) *Attorney, Agent, or Firm* — Lewis Roca Rothgerber Christie LLP

(57) ABSTRACT

A display device includes a display module, a support part arranged on a rear surface of the display module and including a support plate and a plurality of support bars, a first case configured to accommodate the display module and the support part, a second case coupled to the first case so as to be movable away from or closer to the first case in a first direction, a first rotating unit below some support bars, of the plurality of support bars, arranged horizontally together with the support plate, a second rotating unit below some other support bars of the plurality of support bars, and belt units each configured to couple a portion of the first rotating unit and a portion of the second rotating unit adjacent to each other, and the support part is movable according to a rotation of the first and second rotating units.

19 Claims, 21 Drawing Sheets

DISPLAY DEVICE

CROSS-REFERENCE TO RELATED APPLICATION

This application claims priority to and the benefit of Korean Patent Application No. 10-2019-0037275, filed on Mar. 29, 2019 in the Korean Intellectual Property Office, the entire content of which is hereby incorporated by reference.

BACKGROUND

1. Field

Aspects of embodiments of the present disclosure herein relate to a display device, and more particularly, to a display device in which deformation of a support bar supporting a display module may be prevented.

2. Description of the Related Art

Electronic devices, such as a smartphone, a digital camera, a laptop computer, a navigation device, and a smart TV, which provide images to a user, generally include a display device for displaying an image. A display device generates an image and provides the image to a user through a display screen.

Recently, various types of display devices are being developed with the development of technology of display devices. For example, a flexible display device that may be folded or rolled is under development. The flexible display device, the shape of which may be variously changed, may be easy to carry, and improve the convenience of a user.

The flexible display device includes a flexible display module. The display module is accommodated in a case, and is expanded by being pulled out from the case to the outside as needed. A variety of structures may be required for easily pulling out the display module to the outside.

SUMMARY

According to an aspect of embodiments of the present disclosure, a display device is provided in which deformation of a support bar supporting a display module may be prevented. According to another aspect of embodiments of the present disclosure, a display device is provided in which a support bar supporting a display module may move easily.

According to one or more embodiments of the inventive concept, a display device includes: a display module; a support part arranged on a rear surface of the display module and including a support plate and a plurality of support bars; a first case configured to accommodate the display module and the support part; a second case coupled to the first case so as to be movable away from or closer to the first case in a first direction; a first rotating unit below some support bars, of the plurality of support bars, arranged horizontally together with the support plate; a second rotating unit below some other support bars of the plurality of support bars; and belt units each configured to couple a portion of the first rotating unit and a portion of the second rotating unit together adjacent to each other, wherein the support part is movable according to a rotation of the first rotating unit and the second rotating unit.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to describe principles of the inventive concept. In the drawings.

DETAILED DESCRIPTION

Figure 1:
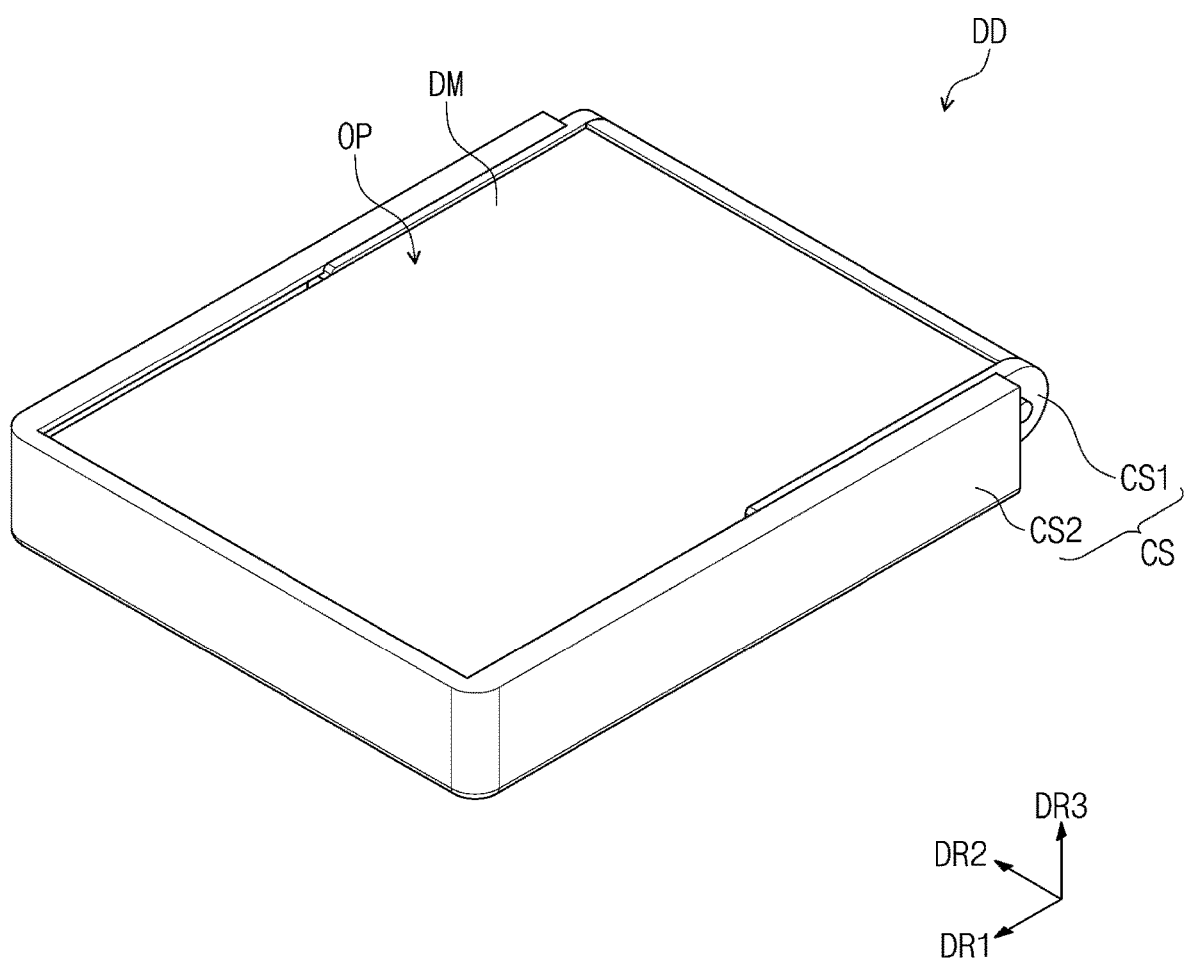
FIG. 1 is a perspective view of a display device according to an embodiment of the inventive concept.

It is to be understood that when an element or layer is referred to as being "on," "connected to," or "coupled to" another element or layer, it may be directly on, connected, or coupled to the other element or layer, or one or more intervening elements or layers may be present.

Like reference numerals refer to like elements throughout this specification. In the figures, the thicknesses, ratios, and dimensions of elements may be exaggerated for effective description of the technical contents.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a "second" element, component, region, layer, or section without departing from the teachings of the present invention. As used herein, the singular forms, "a," "an," and "the" are intended to include the plural forms as well, unless the context clearly indicates otherwise.

Spatially relative terms, such as "beneath," "below," "lower," "above," and "upper," may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

It is to be further understood that the terms "include" and/or "including," when used in this specification, specify the presence of stated features, integers, steps, operations, elements, and/or components, but do not preclude the presence or addition of one or more other features, integers, steps, operations, elements, components, and/or groups thereof.

Herein, the present invention will be explained in further detail with reference to the accompanying drawings.

Figure 2:
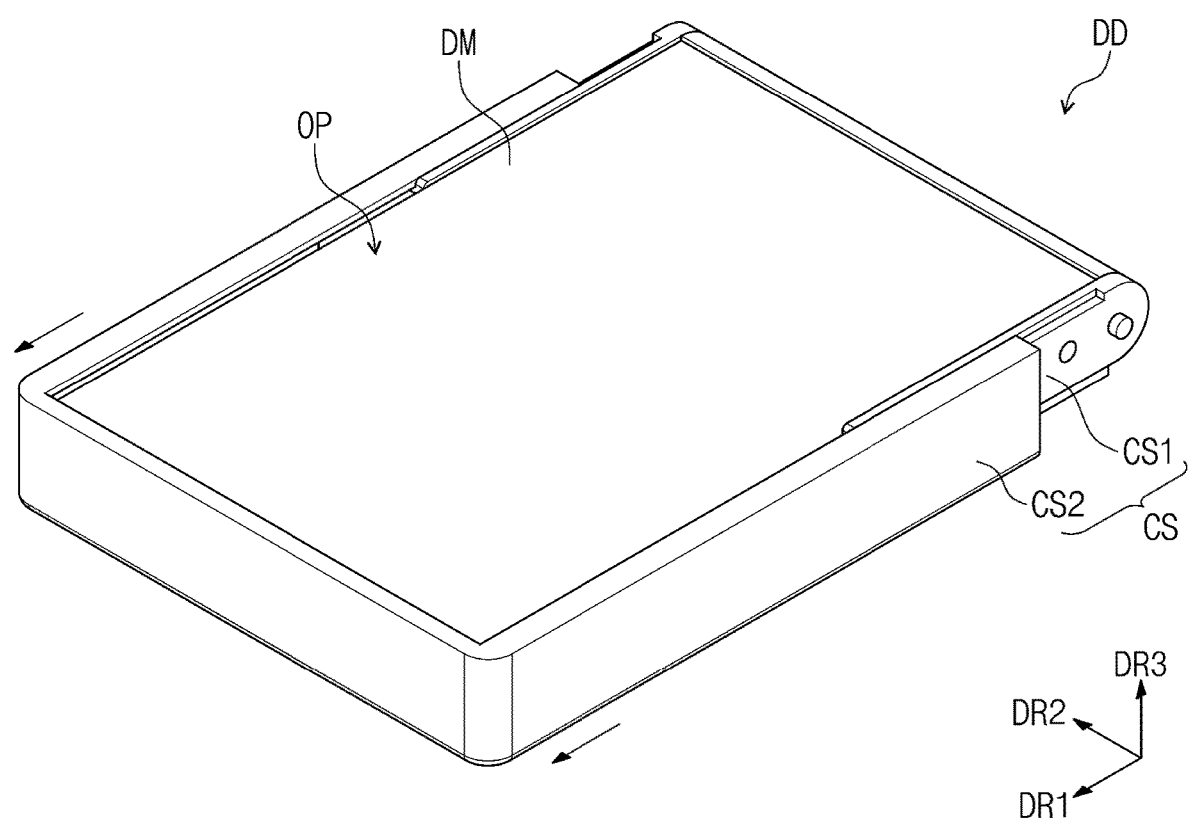
FIG. 2 illustrates an expanded mode of the display device illustrated in FIG. 1.

FIG. 1 is a perspective view of a display device according to an embodiment of the inventive concept; and FIG. 2 illustrates an expanded mode of the display device illustrated in FIG. 1.

Referring to FIG. 1, a display device DD according to an embodiment of the inventive concept may include a display module DM and a case CS accommodating the display module DM. The display module DM may be exposed to the outside through an opening OP defined in an upper portion of the case CS.

The case CS may include a first case CS1 and a second case CS2 that are coupled together to accommodate the display module DM. The second case CS2 may be coupled to the first case CS1 so as to move in a first direction DR1.

Herein, a direction crossing the first direction DR1 is defined as a second direction DR2. A direction substantially perpendicular to a plane defined by the first and second directions DR1 and DR2 is defined as a third direction DR3. In this specification, "when viewed in a plane" may mean a state of viewing in the third direction DR3.

A configuration of the first and second cases CS1 and CS2 will be described in further detail later with reference to an exploded perspective view of the case CS illustrated in FIG. 7.

Referring to FIGS. 1 and 2, the second case CS2 may move away from or closer to the first case CS1 in the first direction DR1. When the second case CS2 moves in the first direction DR1, the area of an exposed surface of the display module DM may be adjusted according to the movement of the second case CS2. A base mode and an expanded mode of the display device DD may be implemented in accordance with the movement of the second case CS2.

For example, the display module DM may be a flexible display module and be supported by a support part (illustrated in FIG. 17) disposed below the display module DM. The support part may be connected to the second case CS2, and when the second case CS2 moves away from the first case CS1 in the first direction DR1, the support part may also move away from the first case CS1 in the first direction DR1.

Although not illustrated, a portion of the display module DM not exposed to the outside in addition to another portion of the display module DM exposed through the opening OP may be disposed in the first case CS1. The display module DM disposed on the support part moves in the first direction DR1 together with the support part in accordance with the movement of the second case CS2, and, as a result, an exposed surface of the display module DM may be expanded. As the exposed surface of the display module DM is expanded, a user may view an image through a larger screen. A state of the display device DD in which the exposed surface of the display module DM is expanded may be defined as the expanded mode.

As illustrated in FIG. 1, the exposed surface of the display module DM may be set to a minimum in a state in which the first case CS1 and the second case CS2 are adjacently coupled to each other. For example, as illustrated in FIG. 1, the second case CS2 may be moved closest to the first case CS1 in the first direction DR1, such that the first case CS1 and the second case CS2 may be disposed adjacent to each other. Such a state of the display device DD may be defined as the base mode.

Figure 3:
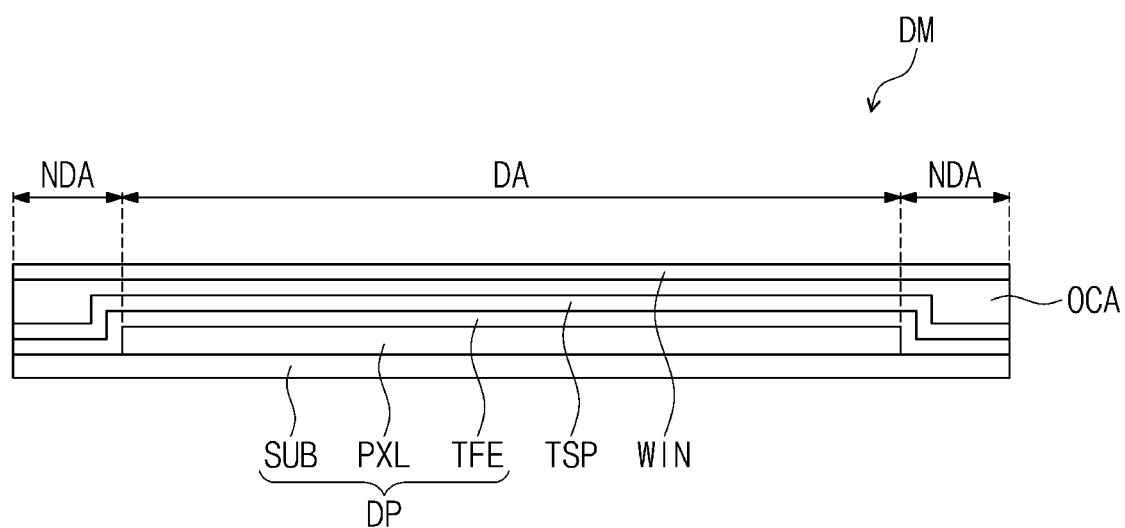
FIG. 3 is a schematic cross-sectional view of a display module illustrated in FIG. 1.

FIG. 3 is a schematic cross-sectional view of the display module illustrated in FIG. 1.

Referring to FIG. 3, in an embodiment, the display module DM may include a display panel DP, a touch sensing part TSP disposed on the display panel DP, a window WIN disposed on the touch sensing part TSP, and an adhesive OCA disposed between the touch sensing part TSP and the window WIN.

The display panel DP according to an embodiment of the inventive concept may be a light emitting display panel. However, embodiments of the inventive concept are not limited thereto, and any of various display panels capable of displaying an image, such as a liquid crystal display panel, an electrowetting display panel, and an electrophoretic display panel, may be used as the display panel DP. The display panel DP may be a flexible display panel.

The display panel DP according to an embodiment of the inventive concept may be a light emitting display panel, and is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include any of a quantum dot, a quantum rod, and the like. Herein, the display panel DP is described as an organic light emitting display panel.

The display panel DP may include a substrate SUB, a pixel layer PXL disposed on the substrate SUB, and a thin film encapsulation layer TFE disposed on the substrate SUB to cover the pixel layer PXL. In an embodiment, the substrate SUB is a transparent substrate and may include a flexible plastic substrate. For example, the substrate SUB may include polyimide (PI).

The substrate SUB may include a display region DA and a non-display region NDA around the display region DA. The pixel layer PXL may be disposed on the display region DA. The pixel layer PXL may include a plurality of pixels, and each of the pixels may include a light emitting element.

In an embodiment, the thin film encapsulation layer TFE may include at least two inorganic layers and an organic layer disposed between the inorganic layers. The inorganic layers may include an inorganic material and protect the pixel layer PXL from moisture and/or oxygen. The organic layer may include an organic material and protect the pixel layer PXL from foreign matter, such as dust particles.

The touch sensing part TSP may be disposed on the thin film encapsulation layer TFE. The touch sensing part TSP may sense an external input (e.g., a user's hand or a touch pen) to convert the sensed external input into an input signal (e.g., a predetermined input signal). The touch sensing part TSP may include a plurality of sensing electrodes for sensing an external input. In an embodiment, the sensing electrodes may sense an external input in a capacitive method.

In an embodiment, the touch sensing part TSP may be manufactured directly on the thin film encapsulation layer TFE when the display module DM is manufactured. However, the touch sensing part TSP is not limited thereto and may be manufactured as a touch panel separate from the display panel DP to be attached to the display panel DP with an adhesive.

The window WIN may protect the display panel DP and the touch sensing part TSP from external scratches and impacts. The window WIN may be attached to the touch sensing part TSP by the adhesive OCA. In an embodiment, the adhesive OCA may include an optically clear adhesive. An image generated in the display panel DP may be provided to a user through the window WIN.

Figure 4:
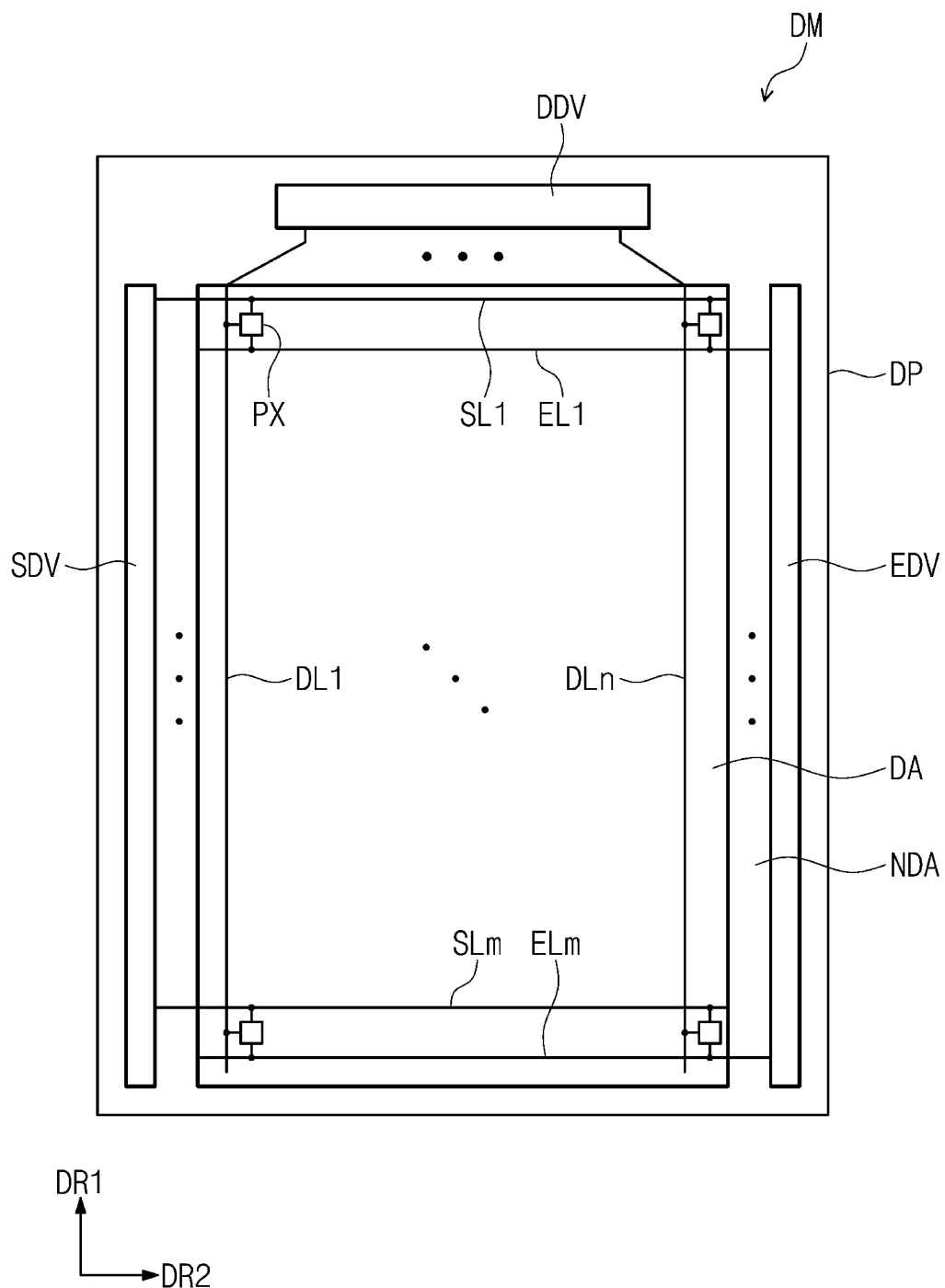
FIG. 4 is a plan view of the display module illustrated in FIG. 3.

FIG. 4 is a plan view of the display module illustrated in FIG. 3.

Referring to FIG. 4, the display module DM may include the display panel DP, a scan driver SDV, a data driver DDV, and an emission driver EDV. A planar configuration of the display panel DP is exemplarily illustrated in FIG. 4.

In an embodiment, the display panel DP may have a rectangular shape having long sides in the first direction DR1 and short sides in the second direction DR2. The display panel DP may have a plane defined by the first and second directions DR1 and DR2. The display panel DP may include the display region DA and the non-display region NDA around or surrounding the display region DA.

The display panel DP may include a plurality of pixels PX, a plurality of scan lines SL1 to SLm, a plurality of data lines DL1 to DLn, and a plurality of light emission lines ELI to Elm, where m and n are natural numbers. The pixels PX may be disposed in the display region DA and be connected to the scan lines SL1 to SLm, the data lines DL1 to DLn, and the light emission lines ELI to ELm.

The scan driver SDV, the data driver DDV, and the emission driver EDV may be disposed in the non-display region NDA. In an embodiment, the scan driver SDV may be disposed in a portion of the non-display region NDA adjacent to a first side of the display panel DP defined as one of the long sides of the display panel DP.

In an embodiment, the emission driver EDV may be disposed in a portion of the non-display region NDA adjacent to the other side of the display panel DP defined as an opposite side of the first side of the display panel DP. In an embodiment, the data driver DDV may be manufactured in the form of an integrated circuit chip and disposed in a portion of the non-display region NDA adjacent to one of the short sides of the display panel DP.

In an embodiment, the scan lines SL1 to SLm may extend in the second direction DR2 to be connected to the scan driver SDV, the data lines DL1 to DLn may extend in the first direction DR1 to be connected to the data driver DDV, and the light emission lines ELI to ELm may extend in the second direction DR2 to be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of light emission signals, and the light emission signals may be applied to the pixels PX through the light emission lines ELI to ELm.

Although not illustrated, a timing controller (not illustrated) for controlling the operation of the scan driver SDV, the data driver DDV, and the emission driver EDV may be included in the display module DM.

The timing controller may generate a scan control signal, a data control signal, and a light emission control signal in response to control signals received from the outside. The timing controller may receive image signals from the outside, convert a data format of the image signals according to an interface specification with the data driver DDV, and provide the image signals having the converted data format to the data driver DDV.

The scan driver SDV may generate the scan signals in response to the scan control signal, and the emission driver EDV may generate the light emission signals in response to the light emission control signal. The data driver DDV may receive the image signals having the converted data format, and generate the data voltages corresponding to the image signals in response to the data control signal.

The pixels PX may receive the data voltages in response to the scan signals. The pixels PX may display an image by emitting light of luminance corresponding to the data voltages in response to the light emission signals. The light emission time of the pixels PX may be controlled by the light emission signals.

Figure 5:
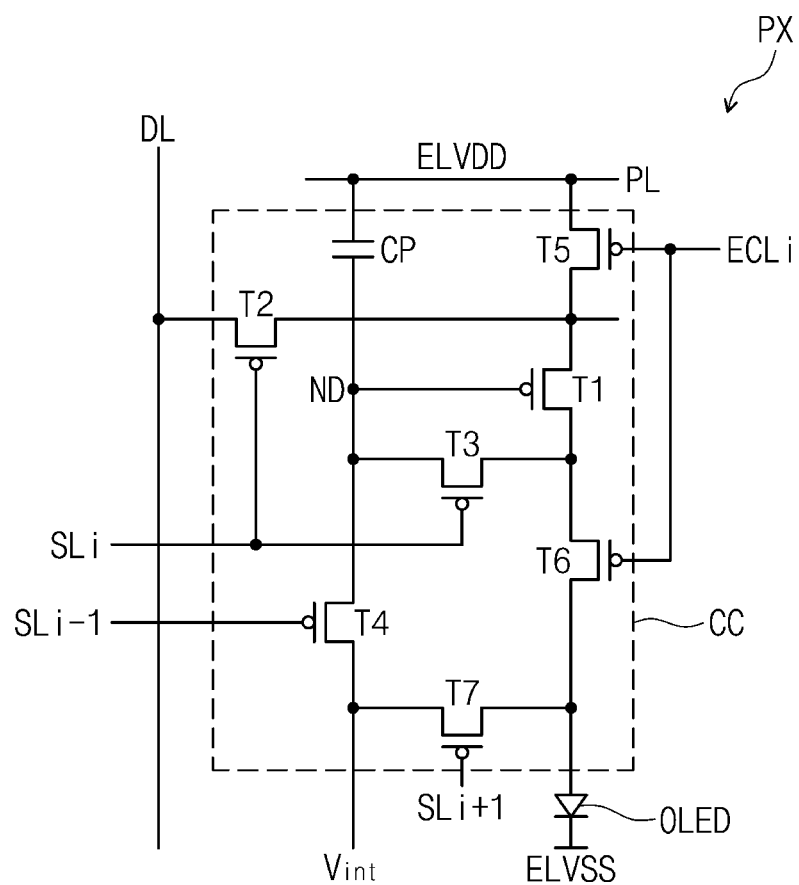
FIG. 5 is an example equivalent circuit of one of pixels illustrated in FIG. 4.

FIG. 5 is an example equivalent circuit of one of the pixels illustrated in FIG. 4.

Referring to FIG. 5, each of the pixels PX may include an organic light emitting element OLED and a pixel circuit CC. In an embodiment, the pixel circuit CC may include a plurality of transistors T1 to T7 and a capacitor CP. The pixel circuit CC may control the amount of current flowing into the organic light emitting element OLED, depending on a corresponding data voltage of the data voltages.

The organic light emitting element OLED may emit light of predetermined luminance corresponding to the amount of the current provided from the pixel circuit CC. To this end, a first voltage ELVDD may be set to be higher than a second voltage ELVSS.

Each of the transistors T1 to T7 may include an input electrode (or a source electrode), an output electrode (or a drain electrode), and a control electrode (or a gate electrode). For convenience, one of the input electrode and the output electrode may be referred to as a first electrode, and the other may be referred to as a second electrode, in this specification.

The first electrode of a first transistor T1 may be connected to the first voltage ELVDD via a fifth transistor T5, and the second electrode thereof may be connected to an anode of the organic light emitting element OLED via a sixth transistor T6. The first transistor T1 may be referred to as a driving transistor in this specification. The first transistor T1 may control the amount of current flowing into the organic light emitting element OLED depending on a voltage applied to the control electrode of the first transistor T1.

A second transistor T2 may be connected between a data line DL and the first electrode of the first transistor T1, and the control electrode of the second transistor T2 may be connected to an ith scan line SLi. The second transistor T2 is turned on when an ith scan signal Si is provided to the ith scan line SLi, such that the second transistor T2 may electrically connect the data line DL to the first electrode of the first transistor T1.

A third transistor T3 may be connected between the second electrode and the control electrode of the first transistor T1. The control electrode of the third transistor T3 may be connected to the ith scan line SLi. The third transistor T3 is turned on when the ith scan signal Si is provided to the ith scan line SLi, such that the third transistor T3 may electrically connect the second electrode and the control electrode of the first transistor T1. The first transistor T1 may be connected in the form of a diode when the third transistor T3 is turned on.

A fourth transistor T4 may be connected between a node ND and an initialization power generating unit (not illustrated). The control electrode of the fourth transistor T4 may be connected to an (i−1)th scan line SLi−1. The fourth transistor T4 is turned on when an (i−1)th scan signal Si−1 is provided to the (i−1)th scan line SLi−1, such that the fourth transistor T4 may provide an initialization voltage Vint to the node ND.

The fifth transistor T5 may be connected between a power line PL and the first electrode of the first transistor T1. The control electrode of the fifth transistor T5 may be connected to an ith light emission line ECLi.

The sixth transistor T6 may be connected between the second electrode of the first transistor T1 and the anode of the organic light emitting element OLED. The control electrode of the sixth transistor T6 may be connected to the ith light emission line ECLi.

A seventh transistor T7 may be connected between the initialization power generating unit (not illustrated) and the anode of the organic light emitting element OLED. The control electrode of the seventh transistor T7 may be connected to an (i+1)th scan line SLi+1. The seventh transistor T7 is turned on when an (i+1)th scan signal Si+1 is provided to the (i+1)th scan line SLi+1, such that the seventh transistor T7 may provide the initialization voltage Vint to the anode of the organic light emitting element OLED.

The seventh transistor T7 may improve black display capability of the pixel PX. When the seventh transistor T7 is turned on, a parasitic capacitor (not illustrated) of the organic light emitting element OLED may be discharged. In this case, the organic light emitting element OLED does not emit light by a leakage current from the first transistor T1 when black luminance is implemented, and, thus, the black display capability may be improved.

Although the control electrode of the seventh transistor T7 is illustrated to be connected to the (i+1)th scan line SLi+1 in FIG. 5, embodiments of the inventive concept are not limited thereto. In another embodiment of the inventive concept, the control electrode of the seventh transistor T7 may be connected to the ith scan line SLi or the (i−1)th scan line SLi−1.

The pixel PX is illustrated in FIG. 5 with respect to PMOS but is not limited thereto. In another embodiment of the inventive concept, the pixel PX may be constituted of NMOS. In another embodiment of the inventive concept, the pixel PX may be constituted of a combination of NMOS and PMOS.

The capacitor CP may be disposed between the power line PL and the node ND. The capacitor CP may store the corresponding data voltage of the data voltages. When the fifth transistor T5 and the sixth transistor T6 are turned on, the amount of current flowing in the first transistor T1 may be determined depending on the voltage stored in the capacitor CP.

In embodiments of the inventive concept, the configuration of the pixel PX is not limited to the configuration illustrated in FIG. 5. In another embodiment of the inventive concept, the pixel PX may be implemented in any of various configurations for emitting light in the organic light emitting element OLED.

Figure 6:
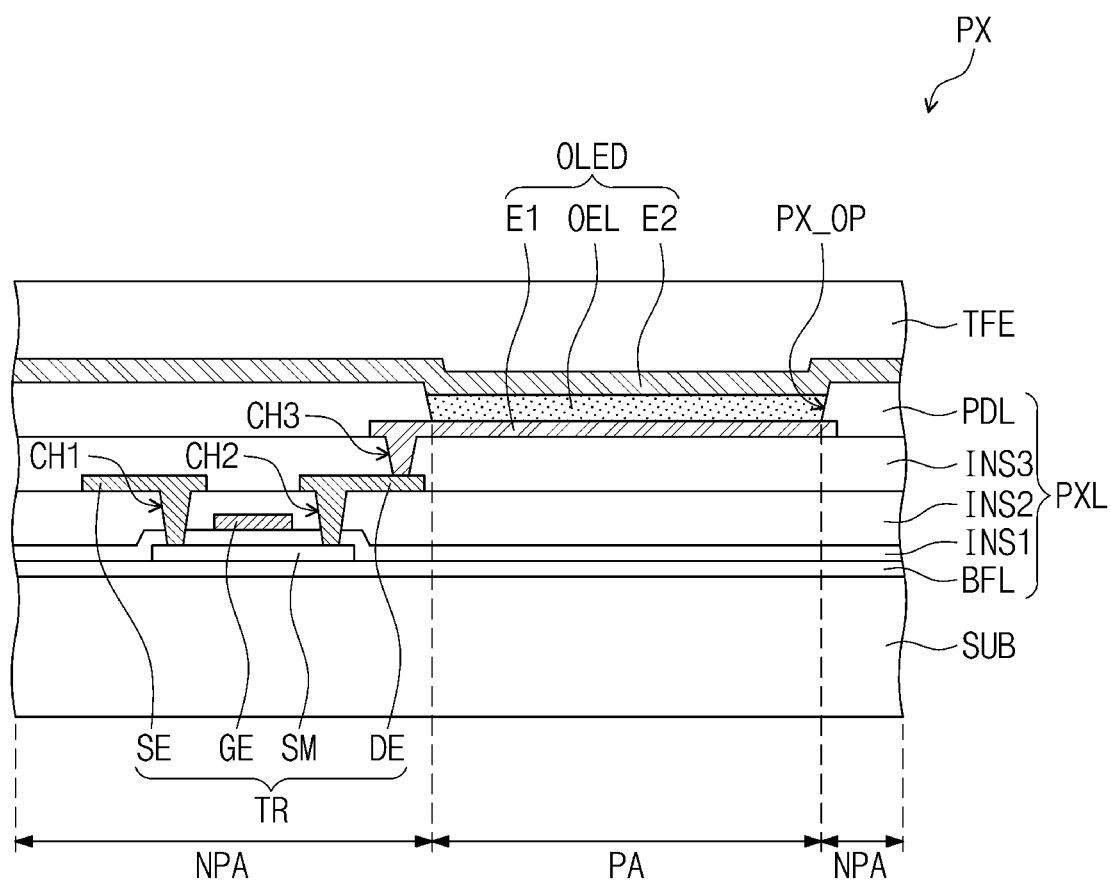
FIG. 6 is a cross-sectional view of a portion corresponding to a light emitting element illustrated in FIG. 5.

FIG. 6 is a cross-sectional view of a portion corresponding to the light emitting element illustrated in FIG. 5.

Referring to FIG. 6, the pixel PX may include the organic light emitting element OLED and a transistor TR connected to the organic light emitting element OLED. The organic light emitting element OLED may include a first electrode E1, a second electrode E2, and an organic light emitting layer OEL disposed between the first electrode E1 and the second electrode E2. The transistor TR may be the sixth transistor T6 illustrated in FIG. 5. The first electrode E1 may be an anode, and the second electrode E2 may be a cathode.

The pixel PX may be divided into a pixel region PA and a non-pixel region NPA around the pixel region PA. The organic light emitting element OLED may be disposed in the pixel region PA, and the transistor TR may be disposed in the non-pixel region NPA.

The transistor TR and the organic light emitting element OLED may be disposed on the substrate SUB. In an embodiment, a buffer layer BFL may be disposed on the substrate SUB, and the buffer layer BFL may include an inorganic material. A semiconductor layer SM of the transistor TR may be disposed on the buffer layer BFL. The semiconductor layer SM may include a semiconductor of an inorganic material, such as amorphous silicon and polycrystalline silicon, or an organic semiconductor. In addition, the semiconductor layer SM may include an oxide semiconductor.

Although not illustrated in FIG. 6, a source region, a drain region, and a channel region between the source region and the drain region may be included in the semiconductor layer SM.

A first insulating layer INS1 may be disposed on the buffer layer BFL so as to cover the semiconductor layer SM. In an embodiment, the first insulating layer INS1 may include an inorganic material. A gate electrode GE of the transistor TR overlapping the semiconductor layer SM may be disposed on the first insulating layer INS1. The gate electrode GE may be disposed so as to overlap the channel region of the semiconductor layer SM.

A second insulating layer INS2 may be disposed on the first insulating layer INS1 so as to cover the gate electrode GE. The second insulating layer INS2 may be defined as an interlayer insulating layer. The second insulating layer INS2 may include an organic material and/or an inorganic material.

A source electrode SE and a drain electrode DE of the transistor TR may be disposed to be spaced apart from each other on the second insulating layer INS2. The source electrode SE may be connected to the source region of the semiconductor layer SM through a first contact hole CH1 defined as penetrating the first insulating layer INS1 and the second insulating layer INS2. The drain electrode DE may be connected to the drain region of the semiconductor layer SM through a second contact hole CH2 defined as penetrating the first insulating layer INS1 and the second insulating layer INS2.

A third insulating layer INS3 may be disposed on the second insulating layer INS2 so as to cover the source electrode SE and the drain electrode DE of the transistor TR. The third insulating layer INS3 may be defined as a planarizing film for providing a flat upper surface, and may include an organic material.

The first electrode E1 may be disposed on the third insulating layer INS3. The first electrode E1 may be connected to the drain electrode DE of the transistor TR through a third contact hole CH3 defined as penetrating the third insulating layer INS3. The first electrode E1 may be defined as a pixel electrode.

A pixel defining film PDL exposing a predetermined portion of the first electrode E1 may be disposed on the first electrode E1 and the third insulating layer INS3. An opening PX_OP for exposing the predetermined portion of the first electrode E1 may be defined in the pixel defining film PDL.

The organic light emitting layer OEL may be disposed on the first electrode E1 within the opening PX_OP. In an embodiment, the organic light emitting layer OEL may generate light of any one of red, green, and blue. However, the organic light emitting layer OEL is not limited thereto and, in an embodiment, may generate white light by a combination of organic materials that generate red, green, and blue.

The second electrode E2 may be disposed on the pixel defining film PDL and the organic light emitting layer OEL. The second electrode E2 may be defined as a common electrode.

The thin film encapsulation layer TFE may be disposed on the organic light emitting element OLED so as to cover the pixel PX. The layers between the substrate SUB and the thin film encapsulation layer TFE may be defined as the pixel layer PXL.

The first voltage ELVDD may be applied to the first electrode E1, and the second voltage ELVSS may be applied to the second electrode E2. A hole and an electron injected into the organic light emitting layer OEL may combine with each other to generate an exciton, and the organic light emitting element OLED may emit light while the exciton transitions to a ground state. The organic light emitting element OLED emits red, green, and blue light according to a current flow, such that an image may be displayed.

Figure 7:
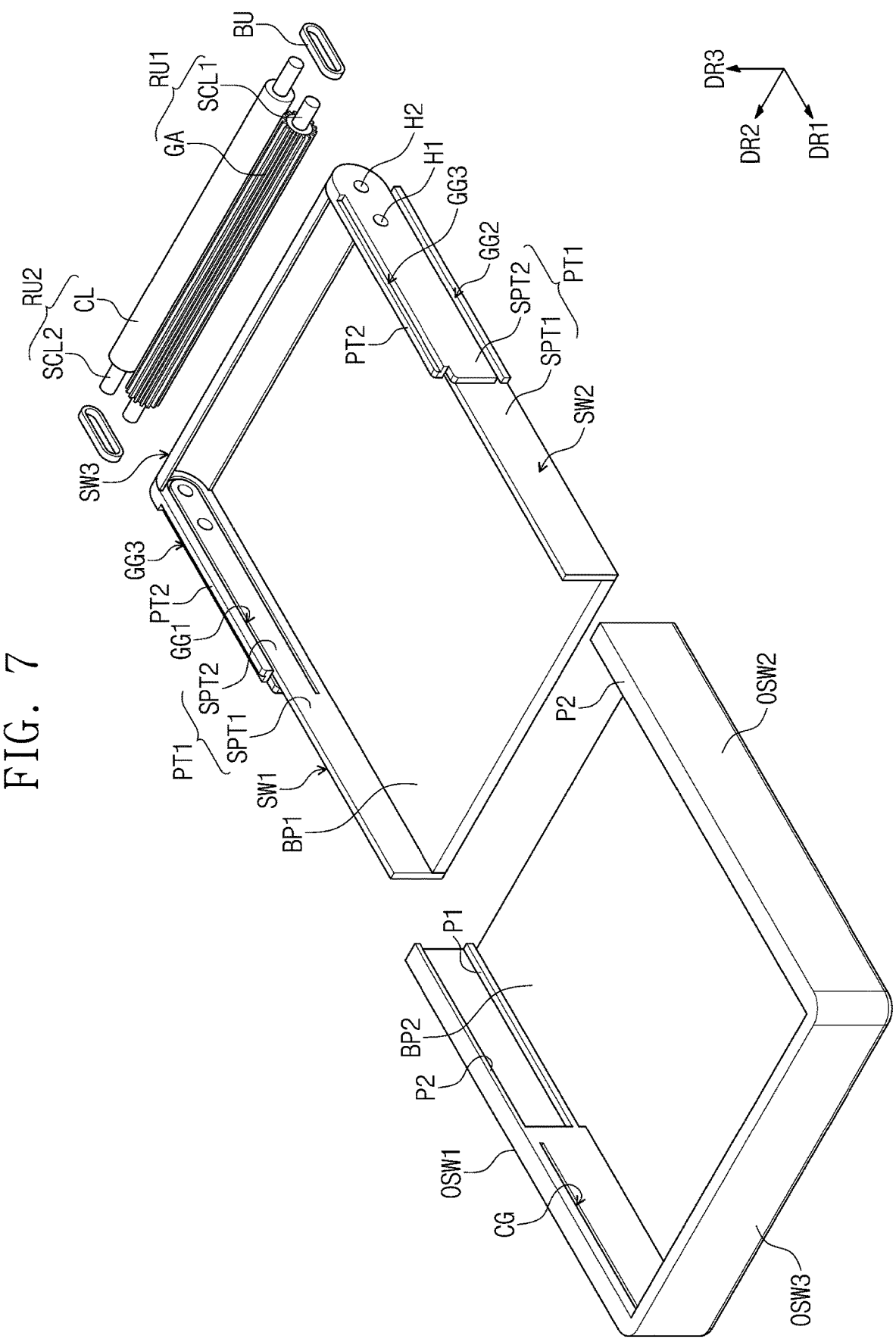
FIG. 7 is an exploded perspective view of a case illustrated in FIG. 1.
Figure 8:
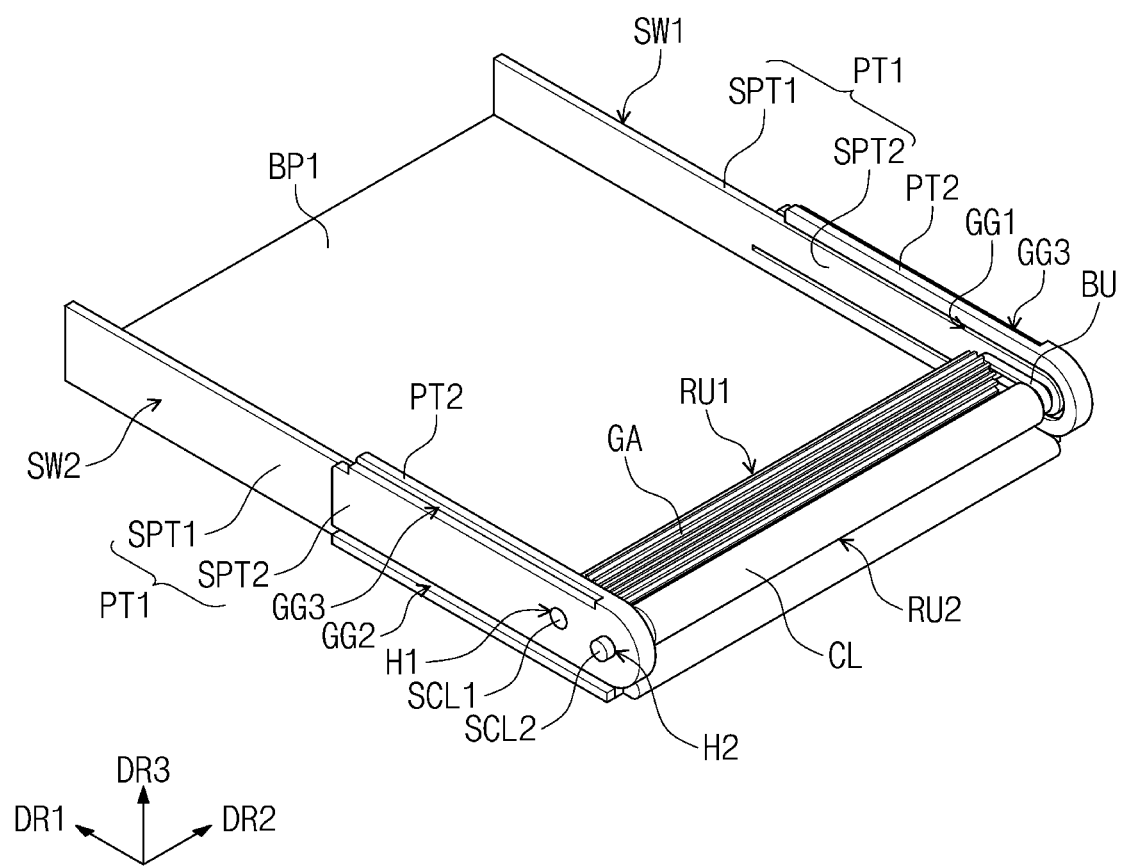
FIG. 8 illustrates a first rotating unit and a second rotating unit disposed in a first case illustrated in FIG. 7.
Figure 9:
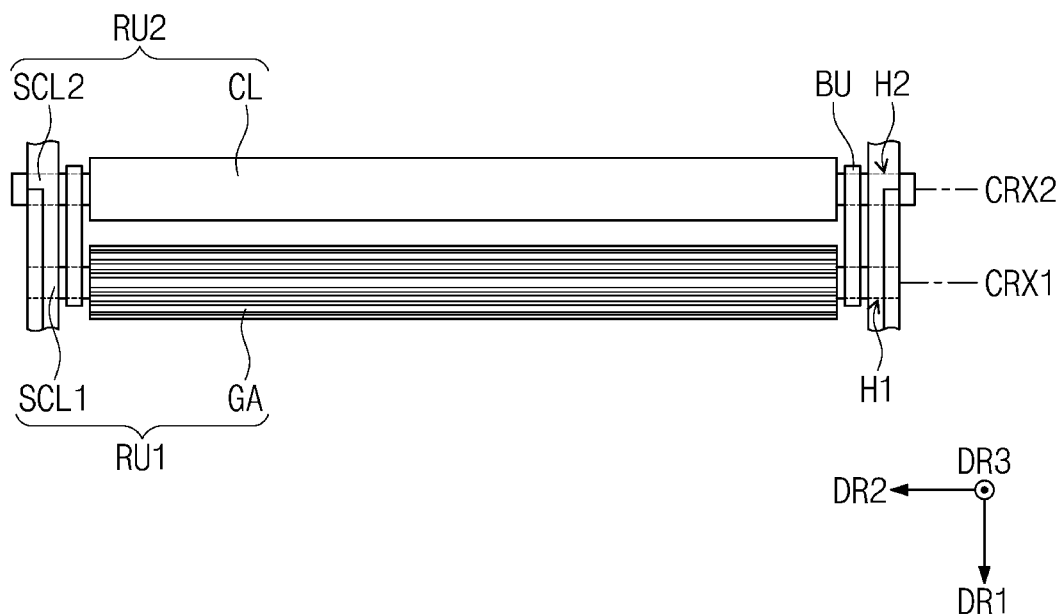
FIGS. 9 and 10 illustrate belt units coupled to the first rotating unit and the second rotating unit illustrated in FIG. 7.
Figure 10:
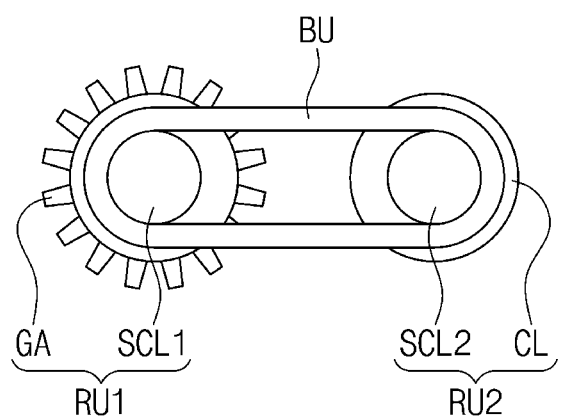

FIG. 7 is an exploded perspective view of the case illustrated in FIG. 1; FIG. 8 illustrates a first rotating unit and a second rotating unit disposed in the first case illustrated in FIG. 7; and FIGS. 9 and 10 illustrate belt units coupled to the first rotating unit and the second rotating unit illustrated in FIG. 7.

A third side wall part SW3 is omitted in FIG. 8 to describe a first rotating unit RU1 and a second rotating unit RU2. Illustrated in FIG. 10 are side surfaces of a belt unit BU and the first and second rotating units RU1 and RU2 viewed in the second direction DR2. The belt unit BU may be provided in plural.

Referring to FIG. 7, the case CS may include the first case CS1, the second case CS2, the first rotating unit RU1, the second rotating unit RU2, and the plurality of belt units BU. The first rotating unit RU1, the second rotating unit RU2, and the belt units BU may be disposed in the first case CS1, and this configuration will be described in further detail later with reference to FIG. 8.

The first case CS1 may include a first side wall part SW1, a second side wall part SW2, the third side wall part SW3, and a first bottom part BP1. The first side wall part SW1 may have a plane defined by the first and third directions DR1 and DR3, and may extend longer in the first direction DR1 than in the third direction DR3.

The second side wall part SW2 may have a plane defined by the first and third directions DR1 and DR3, and may extend longer in the first direction DR1 than in the third direction DR3. The second side wall part SW2 may face the first side wall part SW1 in the second direction DR2.

The first side wall part SW1 and the second side wall part SW2 may have substantially the same shape. In an embodiment, a first side of the first side wall part SW1 and a side of the second side wall part SW2 may have an outwardly convex curved shape.

First guide grooves GG1 may respectively be defined on an inner surface of the first side wall part SW1 and an inner surface of the second side wall part SW2 facing each other. The inner surfaces of the first and second side wall parts SW1 and SW2 may define inner surfaces of the first case CS1 facing each other in the second direction DR2.

Although one of the first guide grooves GG1 defined on the inner surface of the first side wall part SW1 is illustrated in FIG. 7 because of an observation position of the perspective view, although not shown, another of the first guide grooves GG1 may be defined on the inner surface of the second side wall part SW2. The first guide grooves GG1 may have a "U" shape rotated by 90 degrees. A specific shape of the first guide grooves GG1 will be described in further detail later.

Herein, a surface of the first side wall part SW1 opposite to the inner surface of the first side wall part SW1 is defined as an outer surface of the first side wall part SW1. A surface of the second side wall part SW2 opposite to the inner surface of the second side wall part SW2 is defined as an outer surface of the second side wall part SW2. In addition, inner and outer surfaces of sub-components of the first and second side wall parts SW1 and SW2, which will be described below, may correspond to the inner and outer surfaces of the first and second side wall parts SW1 and SW2.

Second guide grooves GG2 extending in the first direction DR1 may respectively be defined on the outer surfaces of the first and second side wall parts SW1 and SW2. Third guide grooves GG3 extending in the first direction DR1 may respectively be defined at upper ends of the first and second side wall parts SW1 and SW2. Although one of the second guide grooves GG2 and one of the third guide grooves GG3 defined in the second side wall part SW2 are illustrated because of an observation position of the perspective view, although not shown, another of the second guide grooves GG2 and another of the third guide grooves GG3 may also be defined in the first side wall part SW1.

Each of the first and second side wall parts SW1 and SW2 may include a first portion PT1 and a second portion PT2 which is disposed on a portion (e.g., a predetermined portion) of the first portion PT1 adjacent to a first side of the first portion PT1 and extends in the first direction DR1. The first side of each of the first portions PT1 may correspond to the first side of a corresponding one of the first and second side wall parts SW1 and SW2. A portion of each of the first guide grooves GG1 may be disposed between the first portion PT1 and the second portion PT2 of a corresponding one of the first and second side wall parts SW1 and SW2.

The first portion PT1 may include a first sub-portion SPT1 not overlapping with the second portion PT2 and a second sub-portion SPT2 overlapping with the second portion PT2. The second sub-portion SPT2 may be disposed below the second portion PT2.

An inner surface of the first sub-portion SPT1 and an inner surface of the second sub-portion SPT2 may be disposed on a same plane. An outer surface of the second sub-portion SPT2 may be disposed more outward than an outer surface of the first sub-portion SPT1. That is, a thickness of the second sub-portion SPT2 may be greater than a thickness of the first sub-portion SPT1 with respect to the second direction DR2.

Each of the second guide grooves GG2 may be defined on the outer surface of a corresponding second sub-portion SPT2. The second guide groove GG2 may be adjacent to a lower end of a corresponding second sub-portion SPT2. Each of the third guide grooves GG3 may be defined at an upper end of a corresponding second portion PT2. The third guide groove GG3 may be defined at an upper end of a corresponding second portion PT2 adjacent to an outer surface of the corresponding second portion PT2.

The third side wall part SW3 may be disposed between the first side of the first side wall part SW1 and the first side of the second side wall part SW2. The third side wall part SW3 may define a side of the first case CS1 of opposite sides of the first case CS1 facing each other in the first direction DR1. The second portion PT2 and the second sub-portion SPT2 may be adjacent to the third side wall part SW3.

The first bottom part BP1 may have a plane defined by the first and second directions DR1 and DR2. The first bottom part BP1 may be connected to lower ends of the first, second, and third side wall parts SW1, SW2, and SW3.

The second case CS2 may include a first outer side wall part OSW1, a second outer side wall part OSW2, a third outer side wall part OSW3, and a second bottom part BP2. The first outer side wall part OSW1 may have a plane defined by the first and third directions DR1 and DR3, and may extend longer in the first direction DR1 than in the third direction DR3.

The second outer side wall part OSW2 may have a plane defined by the first and third directions DR1 and DR3, and may extend longer in the first direction DR1 than in the third direction DR3. The second outer side wall part OSW2 may face the first outer side wall part OSW1 in the second direction DR2. The first outer side wall part OSW1 and the second outer side wall part OSW2 may have substantially the same shape.

The second case CS2 may include first protrusions P1 which respectively protrude from an inner surface of the first outer side wall part OSW1 and an inner surface of the second outer side wall part OSW2 facing each other and extend in the first direction DR1. The first protrusions P1 may respectively extend in the first direction DR1 from first sides of the first and second outer side wall parts OSW1 and OSW2.

Although one of the first protrusions P1 disposed on the inner surface of the first outer side wall part OSW1 is illustrated in FIG. 7 because of an observation position of the perspective view, although not shown, another of the first protrusions P1 may also be disposed on the inner surface of the second outer side wall part OSW2. The first protrusions P1 may be adjacent to lower ends, respectively, of the first and second outer side wall parts OSW1 and OSW2. The first protrusions P1 may be disposed to respectively correspond to positions in which the second guide grooves GG2 are disposed.

The first sides of the first and second outer side wall parts OSW1 and OSW2 may be defined substantially as ends of the first and second outer side wall parts OSW1 and OSW2 adjacent to the first sides of the first and second side wall parts SW1 and SW2 when the first and second cases CS1 and CS2 are coupled to each other. Herein, sides opposite to the first sides of the first and second outer side wall parts OSW1 and OSW2 are defined as second sides of the first and second outer side wall parts OSW1 and OSW2.

The second case CS2 may include second protrusions P2 which protrude respectively from an upper end of the first outer side wall part OSW1 and an upper end of the second outer side wall part OSW2 and extend in the first direction DR1. The second protrusions P2 may extend in the first direction DR1 from the first sides of the first and second outer side wall parts OSW1 and OSW2, respectively.

Although one of the second protrusions P2 protruding from the first outer side wall part OSW1 is illustrated in FIG. 7 because of an observation position of the perspective view, another of the second protrusions P2 may also protrude substantially from the second outer side wall part OSW2. The second protrusions P2 may be disposed to respectively correspond to positions in which the third guide grooves GG3 are disposed.

Connection grooves CG may respectively be defined on the inner surface of the first outer side wall part OSW1 and the inner surface of the second outer side wall part OSW2. The connection grooves CG may respectively be adjacent to the second sides of the first and second outer side wall parts OSW1 and OSW2. Although one of the connection grooves CG defined on the inner surface of the first outer side wall part OSW1 is illustrated in FIG. 7 because of an observation position of the perspective view, although not shown, another of the connection grooves CG may also be defined on the inner surface of the second outer side wall part OSW2. The inner surfaces of the first and second outer side wall parts OSW1 and OSW2 may define inner surfaces of the second case CS2 facing each other in the second direction DR2.

The third outer side wall part OSW3 may face the third side wall part SW3 and be disposed between the first outer side wall part OSW1 and the second outer side wall part OSW2. The third outer side wall part OSW3 may be disposed between the second side of the first outer side wall part OSW1 and the second side of the second outer side wall part OSW2.

The second bottom part BP2 may have a plane defined by the first and second directions DR1 and DR2. The second bottom part BP2 may be connected to the lower ends of the first and second outer side wall parts OSW1 and OSW2, and the lower end of the third outer side wall part OSW3.

The first rotating unit RU1 and the second rotating unit RU2 may have a cylindrical shape extending in the second direction DR2. The first rotating unit RU1 may include a gear part GA extending in the second direction DR2 and first sub-column parts SCL1 extending in the second direction DR2 from opposite ends of the gear part GA opposite to each other in the second direction DR2.

When viewed in the second direction DR2, each of the first sub-column parts SCL1 may have a smaller diameter than the gear part GA. The gear part GA may have a gear shape. For example, the gear part GA may include a plurality of projections which extend in the second direction DR2 and are arranged along an outer circumferential surface of the cylindrical shape.

The second rotating unit RU2 may include a column part CL extending in the second direction DR2 and second sub-column parts SCL2 extending in the second direction DR2 from opposite ends of the column part CL opposite to each other in the second direction DR2. When viewed in the second direction DR2, each of the second sub-column parts SCL2 may have a smaller diameter than the column part CL.

The belt units BU may have a closed curve shape when viewed in the second direction DR2. The belt units BU may be adjacent to the first and second sub-column parts SCL1 and SCL2. Although a number of the belt units BU illustrated by way of example is two, the number of the belt units BU is not limited thereto.

Referring to FIGS. 7 and 8, the first rotating unit RU1 and the second rotating unit RU2 may be disposed in the first case CS1 and connected to the first case CS1. For example, opposite ends of the first rotating unit RU1 may respectively be inserted into first holes H1 defined in the first side wall part SW1 and the second side wall part SW2 to be connected to the first case CS1. The first sub-column parts SCL1 may respectively be inserted into the first holes H1 defined in the first and second side wall parts SW1 and SW2.

Opposite ends of the second rotating unit RU2 may respectively be inserted into second holes H2 defined in the first side wall part SW1 and the second side wall part SW2 to be connected to the first case CS1. The second sub-column parts SCL2 may respectively be inserted into the second holes H2 defined in the first and second side wall parts SW1 and SW2.

The first and second holes H1 and H2 may be adjacent or proximate to the first sides of the first and second side wall parts SW1 and SW2. The second holes H2 may be disposed between the first holes H1 and the first sides of the first and second side wall parts SW1 and SW2, respectively.

The first rotating unit RU1 may rotate about a central axis CRX1 of the first rotating unit RU1 parallel to the second direction DR2. The second rotating unit RU2 may rotate about a central axis CRX2 of the second rotating unit RU2 parallel to the second direction DR2.

Referring to FIGS. 9 and 10, each of the belt units BU may be disposed to surround a portion of the first rotating unit RU1 and a portion of the second rotating unit RU2 adjacent to each other so as to couple the portion of the first rotating unit RU1 and the portion of the second rotating unit RU2. For example, each of the belt units BU may be disposed to surround one of the first sub-column parts SCL1 and one of the second sub-column parts SCL2 adjacent to each other so as to couple the one of the first sub-column parts SCL1 and the one of the second sub-column parts SCL2.

In an embodiment, the length of each of the first sub-column parts SCL1 may be smaller than the length of each of the second sub-column parts SCL2 with respect to the second direction DR2. In an embodiment, ends of the first sub-column parts SCL1 inserted into the first holes H1 may not protrude outward beyond the first and second side wall parts SW1 and SW2, and ends of the second sub-column parts SCL2 inserted into the second holes H2 may protrude outward beyond the first and second side wall parts SW1 and SW2.

In an embodiment, one of the belt units BU may be disposed between the first side wall part SW1 and the gear part GA and between the first side wall part SW1 and the column part CL, and the other of the belt units BU may be disposed between the second side wall part SW2 and the gear part GA and between the second side wall part SW2 and the column part CL.

Although not illustrated, in an embodiment, a driving unit for rotating at least one of the first and second rotating units RU1 and RU2 may further be included in the display device DD. For example, the driving unit may rotate the first rotating unit RU1.

Because the belt units BU are coupled to the first and second rotating units RU1 and RU2, torque of the first rotating unit RU1 may be transmitted to the second rotating unit RU2 by the belt units BU when the first rotating unit RU1 rotates. Accordingly, the second rotating unit RU2 may rotate at a same speed as the first rotating unit RU1.

However, embodiments of the inventive concept are not limited thereto, and the second rotating unit RU2 may be rotated by the driving unit, and torque of the second rotating unit RU2 may be transmitted to the first rotating unit RU1 by the belt units BU. In an embodiment, the first and second rotating units RU1 and RU2 may be rotated by the driving unit, and the first and second rotating units RU1 and RU2 may be controlled by the belt units BU to rotate at a same speed.

Figure 11:
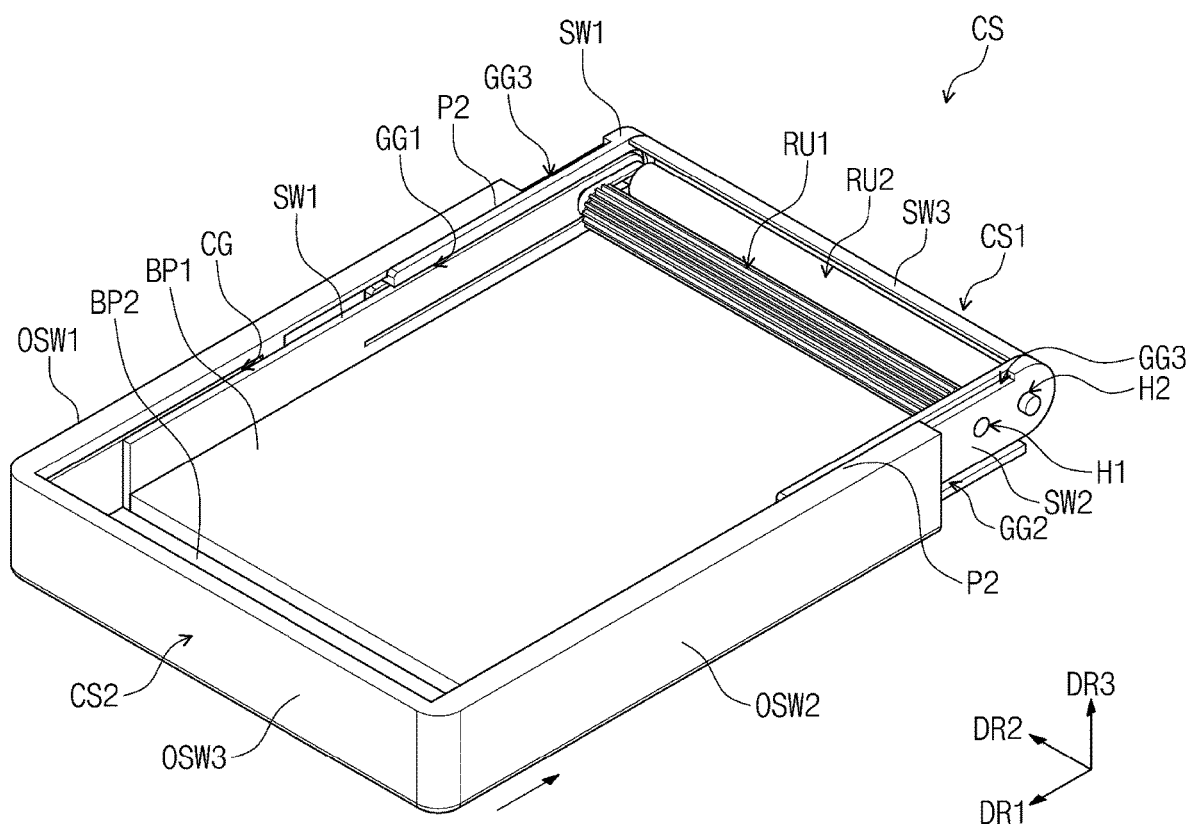
FIGS. 11 and 12 illustrate states in which a second case illustrated in FIG. 7 is coupled to the first case.
Figure 12:
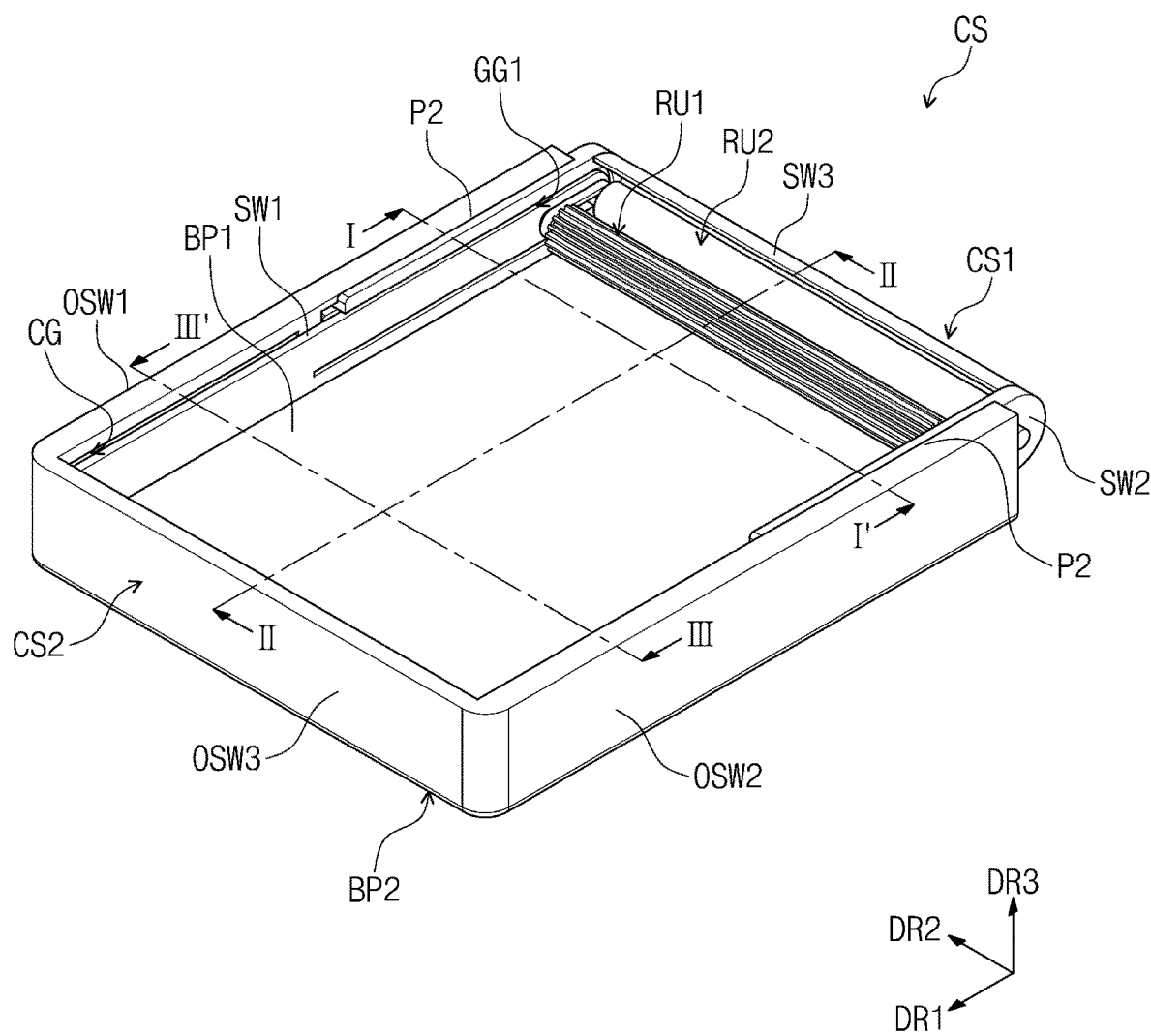

FIGS. 11 and 12 illustrate a state in which the second case illustrated in FIG. 7 is coupled to the first case.

Referring to FIGS. 11 and 12, the second case CS2 may be inserted into the second and third guide grooves GG2 and GG3 to be coupled to the first case CS1. For example, the first protrusions P1 may respectively be inserted into the second guide grooves GG2 and the second protrusions P2 may respectively be inserted into the third guide grooves GG3, such that the second case CS2 may be coupled to the first case CS1. This configuration will be described in further detail below with reference to FIG. 13.

The first outer side wall part OSW1 may be disposed on the outer surface of the first side wall part SW1, and the second outer side wall part OSW2 may be disposed on the outer surface of the second side wall part SW2. The second bottom part BP2 may be disposed under the first bottom part BP1.

When the second case CS2 is coupled to the first case CS1, the first sides of the first and second outer side wall parts OSW1 and OSW2 may be adjacent to the first sides of the first and second side wall parts SW1 and SW2, and the second sides of the first and second outer side wall parts OSW1 and OSW2 may be adjacent to the second sides of the first and second side wall parts SW1 and SW2. The third outer side wall part OSW3 may be adjacent to the second sides of the first and second side wall parts SW1 and SW2.

The first side of the second case CS2 may be adjacent to the first side of the first case CS1, and the second side of the second case CS2 opposite to the first side of the second case CS2 may be adjacent to the second side of the first case CS1. The second side of the second case CS2 may be defined by the third outer side wall part OSW3.

Figure 13:
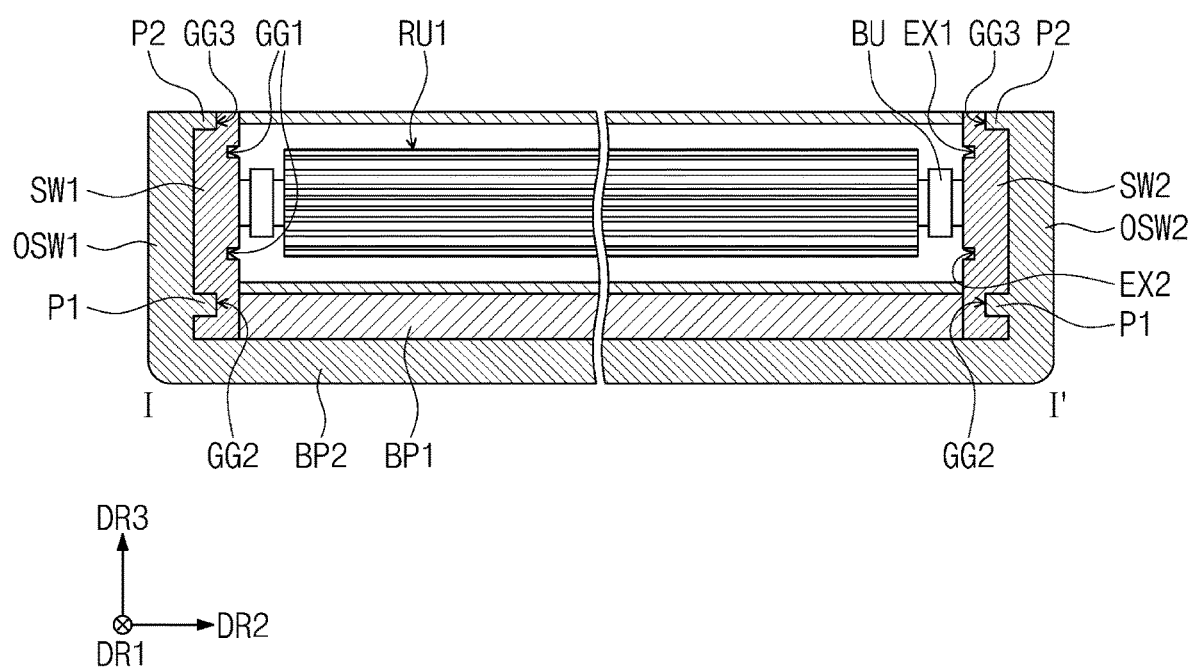
FIG. 13 is a cross-sectional view taken along the line I-I' illustrated in FIG. 12.
Figure 14:
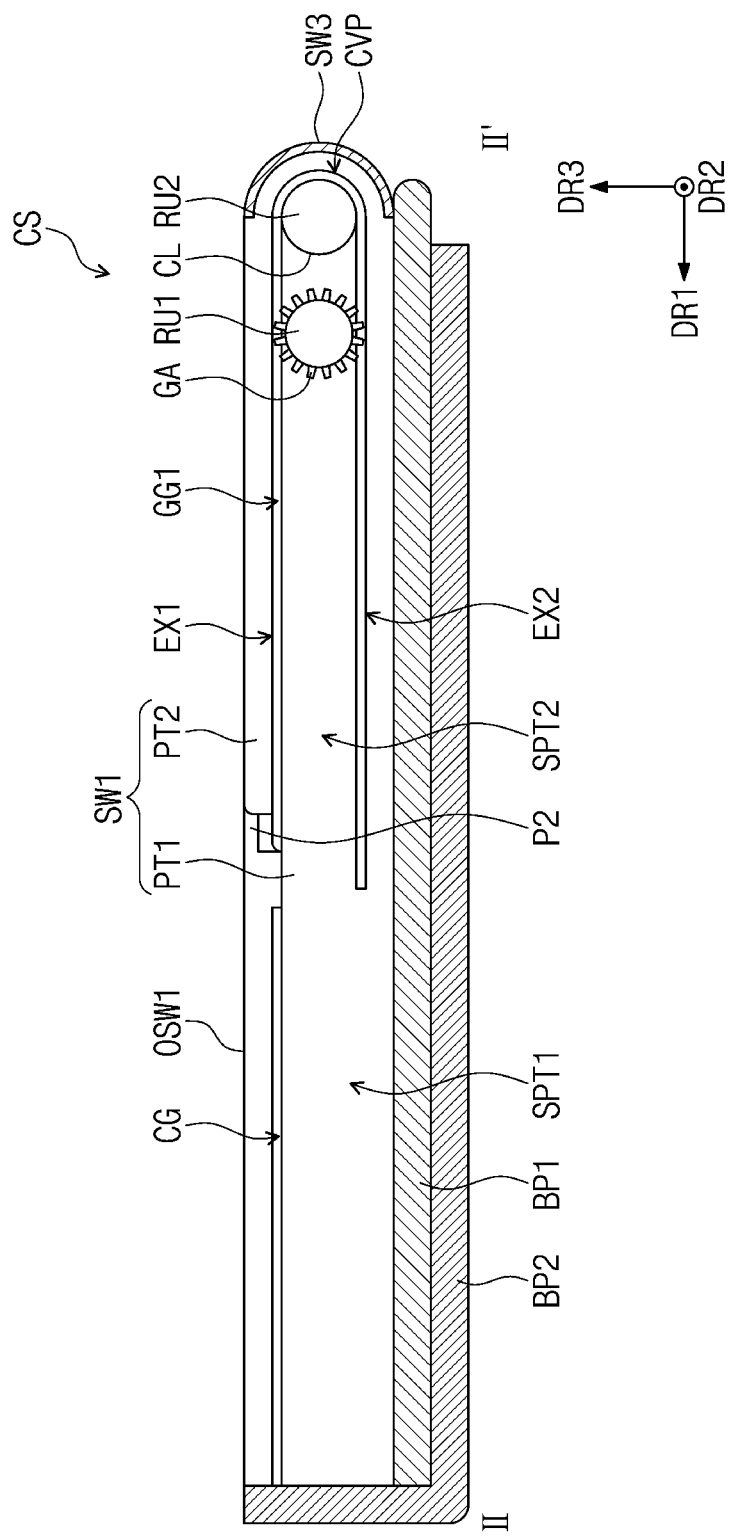
FIG. 14 is a cross-sectional view taken along the line II-II' illustrated in FIG. 12.
Figure 15:
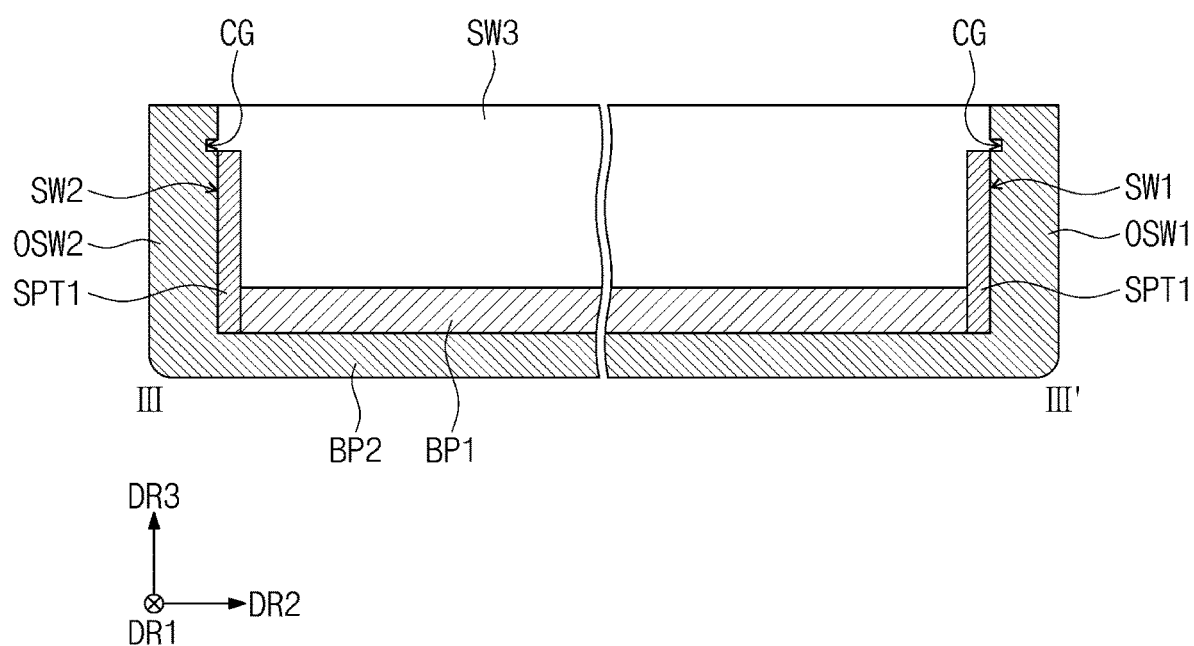
FIG. 15 is a cross-sectional view taken along the line III-III' illustrated in FIG. 12.

FIG. 13 is a cross-sectional view taken along the line I-I' illustrated in FIG. 12; FIG. 14 is a cross-sectional view taken along the line II-II' illustrated in FIG. 12; and FIG. 15 is a cross-sectional view taken along the line III-III' illustrated in FIG. 12.

Referring to FIG. 13, the inner surface of the first outer side wall part OSW1 may be a surface of the first outer side wall part OSW1 facing the outer surface of the first side wall part SW1. The inner surface of the second outer side wall part OSW2 may be a surface of the second outer side wall part OSW2 facing the outer surface of the second side wall part SW2.

The first protrusions P1 may respectively protrude from the inner surfaces of the first and second outer side wall parts OSW1 and OSW2 toward the first and second side wall parts SW1 and SW2. The first protrusions P1 may respectively be adjacent to the lower ends of the first and second outer side wall parts OSW1 and OSW2. The first protrusions P1 may respectively be inserted into the second guide grooves GG2.

The second protrusions P2 may respectively protrude from the upper ends of the first and second outer side wall parts OSW1 and OSW2 toward the first and second side wall parts SW1 and SW2. The second protrusions P2 may respectively be inserted into the third guide grooves GG3.

Referring to FIG. 14, the third side wall part SW3 may have an outwardly convex curved surface shape. In an embodiment, an inner surface of the third side wall part SW3 facing the third outer side wall part OSW3 may have a concave curved surface shape. An outer surface of the third side wall part SW3, which is an opposite surface of the inner surface of the third side wall part SW3, may have the outwardly convex curved surface shape.

Each of the first guide grooves GG1 may be closer to the first side of the first side wall part SW1 (or the second side wall part SW2) than to the second side of the first side wall part SW1 (or the second side wall part SW2). The first guide groove GG1 may include a first extending portion EX1, a second extending portion EX2, and a curved portion CVP. The first extending portion EX1 may extend in the first direction DR1. The second extending portion EX2 may extend in the first direction DR1 and be disposed below the first extending portion EX1.

Although the second extending portion EX2 is exemplarily illustrated to be longer than the first extending portion EX1 in the first direction DR1, a relationship between the length of the second extending portion EX2 and the length of the first extending portion EX1 is not limited thereto.

The curved portion CVP may have a curved shape extending from a first side of the first extending portion EX1 to a first side of the second extending portion EX2. The first side of the first extending portion EX1 and the first side of the second extending portion EX2 may be adjacent to the first side of the first case CS1 (or to the third side wall part SW3). The curved portion CVP may have a curved shape convex toward the first side of the first case CS1 (or toward the third side wall part SW3).

The first rotating unit RU1 and the second rotating unit RU2 may be disposed between the first extending portion EX1 and the second extending portion EX2. The second rotating unit RU2 may be disposed between the first rotating unit RU1 and the curved portion CVP.

Referring to FIGS. 14 and 15, heights of upper ends of the first and second outer side wall parts OSW1 and OSW2 may be greater than heights of the first sub-portions SPT1. The connection grooves CG may respectively be defined in the first and second outer side wall parts OSW1 and OSW2. In an embodiment, when viewed in the second direction DR2, each of the connection grooves CG may not overlap with the first extending portion EX1, but may be disposed substantially in the same line as the first extending portion EX1.

The connection grooves CG may be defined in portions, not overlapping with the first extending portions EX1, of the first and second outer side wall parts OSW1 and OSW2. For example, the connection grooves CG may be defined in portions, disposed above the first sub-portions SPT1, of the first and second outer side wall parts OSW1 and OSW2. The connection grooves CG may be adjacent to the second side of the second case CS2 (or to the third outer side wall part OSW3).

Figure 16:
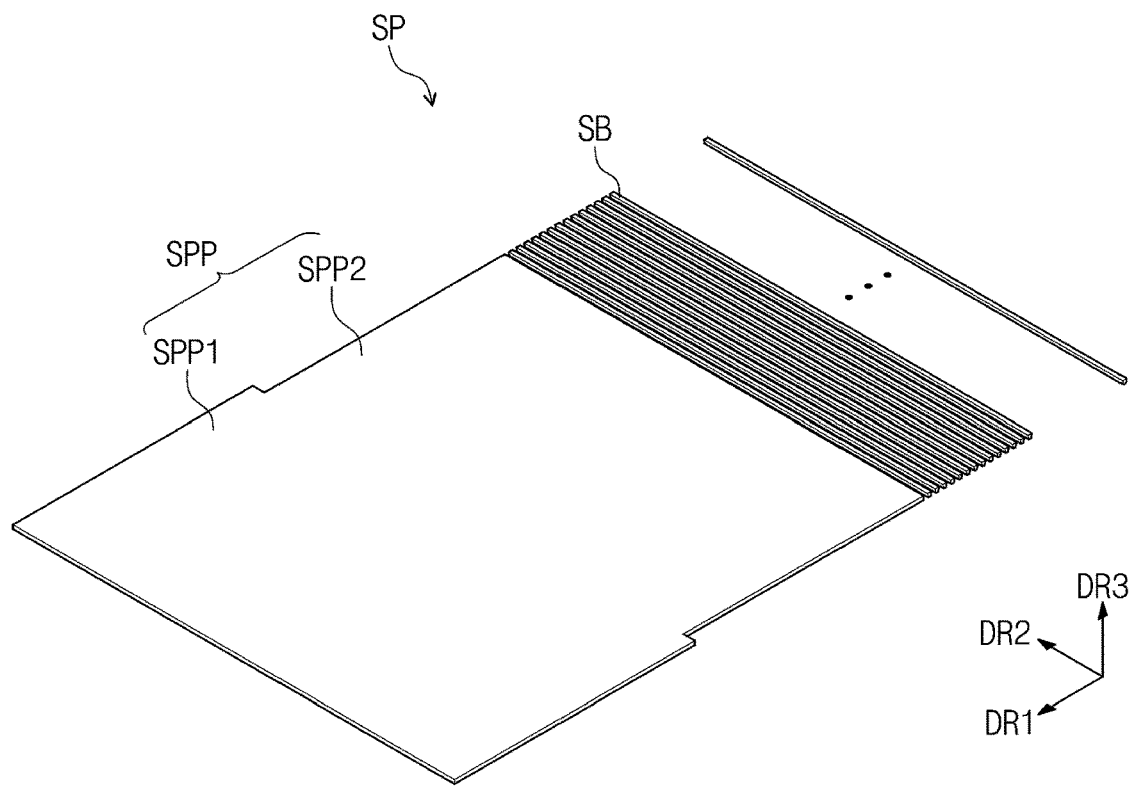
FIG. 16 illustrates a support part to be disposed in a first case illustrated in FIG. 7.
Figure 17:
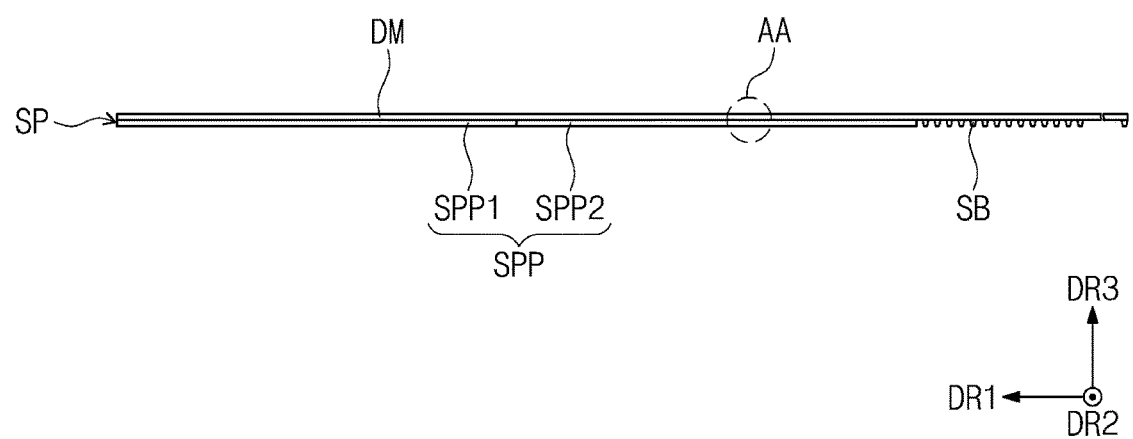
FIG. 17 illustrates the display module disposed on the support part.
Figure 18:
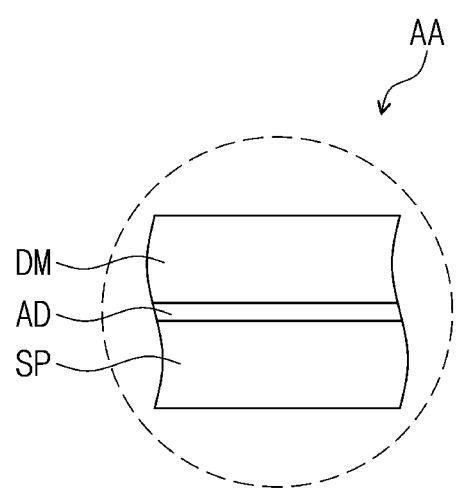
FIG. 18 is an enlarged view of a region "AA" illustrated in FIG. 17.

FIG. 16 illustrates the support part to be disposed in the first case illustrated in FIG. 7; FIG. 17 illustrates the display module disposed on the support part; and FIG. 18 is an enlarged view of a region "AA" illustrated in FIG. 17.

For convenience of description, FIG. 17 illustrates sides of a support part SP and the display module DM viewed in the second direction DR2.

Referring to FIGS. 16 and 17, the display device DD may include the support part SP, and the support part SP may include a support plate SPP and a plurality of support bars SB. The support plate SPP may have a plane defined by the first and second directions DR1 and DR2. The support plate SPP and the support bars SB may be arranged in the first direction DR1.

The support bars SB may extend in the second direction DR2 and be arranged in the first direction DR1. The support bars SB may be spaced apart from each other at predetermined intervals in the first direction DR1. In an embodiment, the support bars SB may have an inverted trapezoidal shape when viewed in the second direction DR2.

Although the support bars SB spaced apart from each other are illustrated by way of example, the structure of the support bars SB is not limited thereto. In an embodiment, for example, the support bars SB may be implemented in an articulated structure coupled to rotate with respect to each other. The support plate SPP may include a first support plate SPP1 and a second support plate SPP2. The second support plate SPP2 may be disposed between the first support plate SPP1 and the support bars SB. In an embodiment, a length of the first support plate SPP1 may be greater than a length of the second support plate SPP2 with respect to the second direction DR2.

Referring to FIGS. 17 and 18, the support part SP may be disposed on a rear surface of the display module DM which is an opposite surface of a front surface of the display module DM. An adhesive AD may be disposed between the display module DM and the support part SP, and the support part SP may be attached to the display module DM by the adhesive AD. Although, in an embodiment, the adhesive AD may include a pressure sensitive adhesive, the adhesive AD is not limited thereto and may include any of various adhesives.

Figure 19:
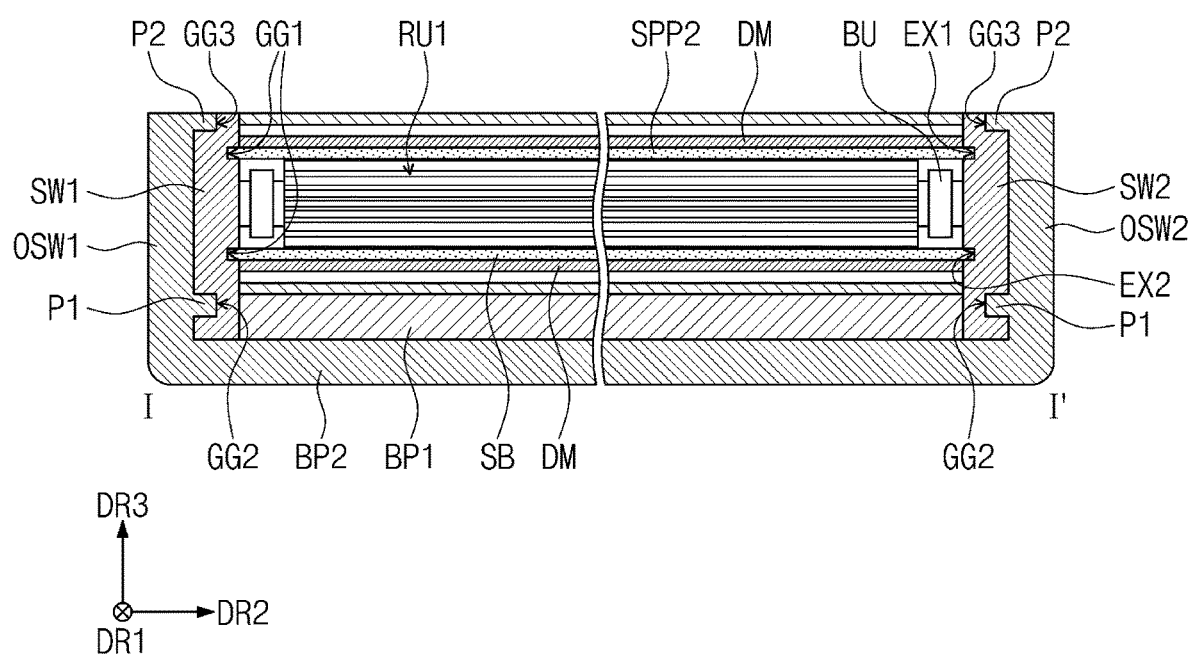
FIGS. 19, 20, and 21 illustrate the support part and the display module disposed in the first and second cases.
Figure 20:
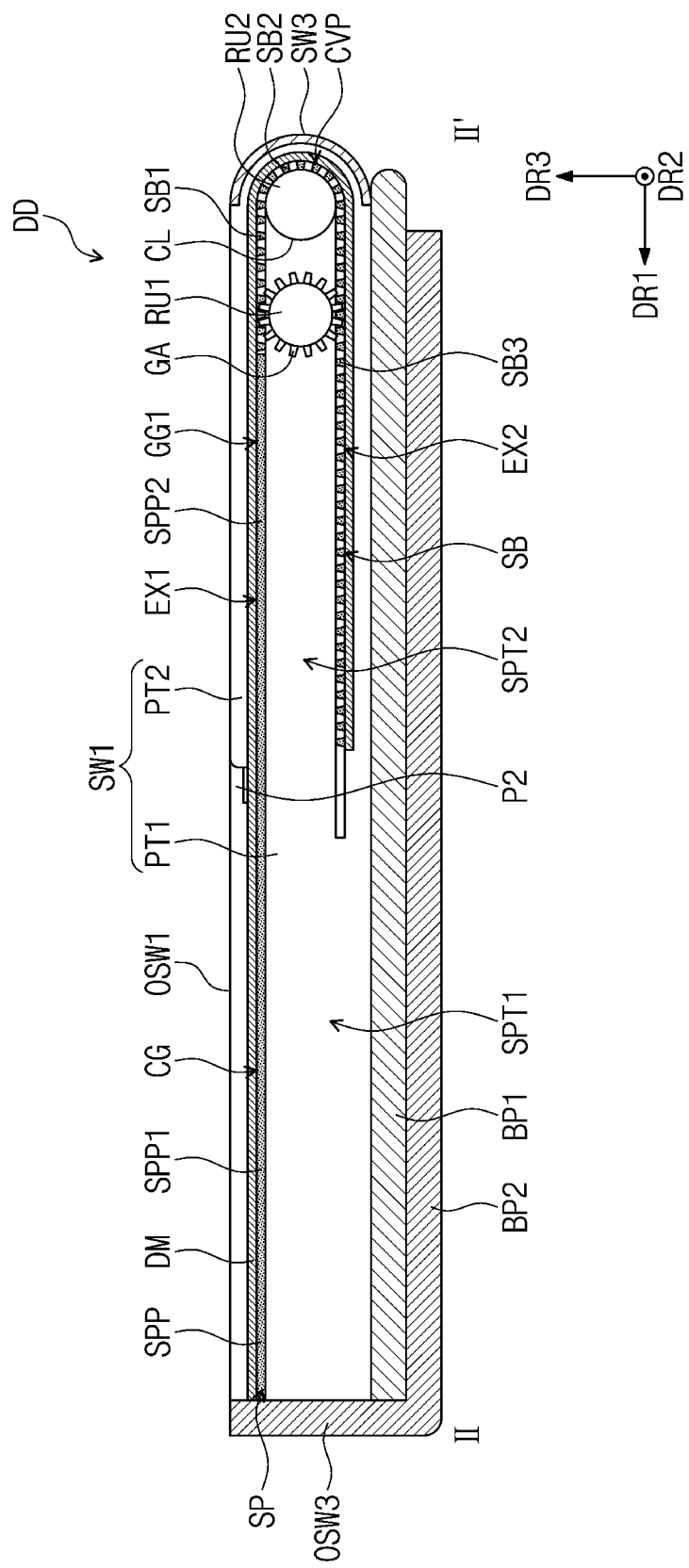
Figure 21:
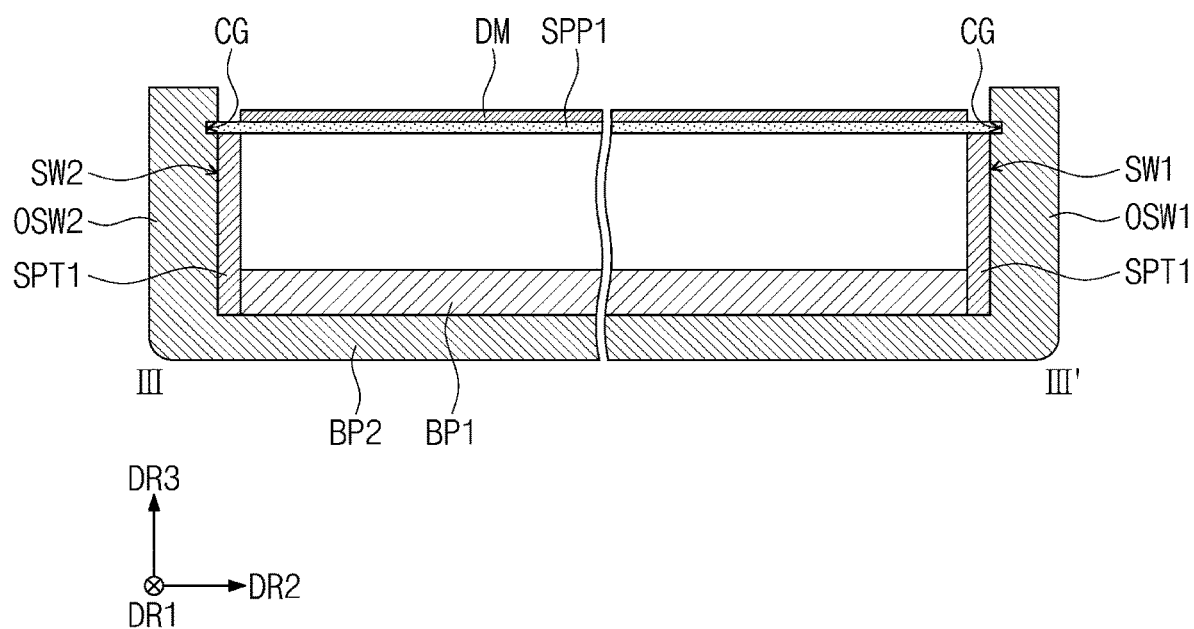
Figure 22:
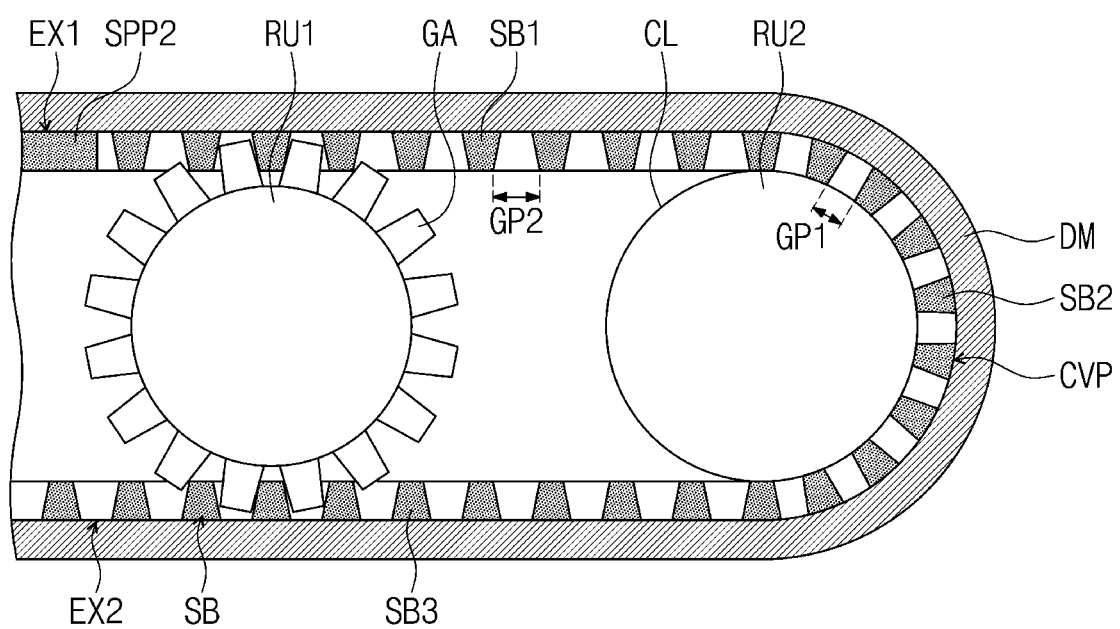
FIG. 22 is an enlarged view of support bars and the first and second rotating units disposed in curved portions and portions of first and second extending portions adjacent to the curved portions illustrated in FIG. 20.

FIGS. 19, 20, and 21 illustrate the support part and the display module disposed in the first and second cases; and FIG. 22 is an enlarged view of the support bars and the first and second rotating units disposed in the curved portions and portions of the first and second extending portions adjacent to the curved portions illustrated in FIG. 20.

FIG. 19 is substantially a cross-sectional view corresponding to FIG. 13; FIG. 20 is substantially a cross-sectional view corresponding to FIG. 14; and FIG. 21 is substantially a cross-sectional view corresponding to FIG. 15.

Referring to FIGS. 19, 20, and 21, the support plate SPP and the support bars SB may be disposed, when viewed in the second direction DR2, on the rear surface of the display module DM, which is the opposite surface of the front surface of the display module DM adjacent to the edge of the first case CS1. The support part SP may be connected to the second case CS2, and opposite sides of the support part SP opposite to each other in the second direction DR2 may respectively be inserted into the first guide grooves GG1, such that the support part SP may move in the first direction DR1.

The support plate SPP may be connected to the second case CS2. For example, as illustrated in FIG. 21, opposite sides of the first support plate SPP1 opposite to each other in the second direction DR2 may respectively be inserted into the connection grooves CG to be connected to the second case CS2. Portions of the first support plate SPP1 adjacent to the opposite sides of the first support plate SPP1 may be disposed on the first sub-portions SPT1 of the first and second side wall parts SW1 and SW2.

The state of the display device DD illustrated in FIG. 20 may be the base mode of the display device DD, a state implemented by the second case CS2 that has moved in the first direction DR1 so as to be closest to the first case CS1.

In the base mode of the display device DD, opposite sides of the support plate SPP may be disposed in the first extending portions EX1. For example, as illustrated in FIG. 19, the opposite sides of the second support plate SPP2 opposite to each other in the second direction DR2 may respectively be disposed to be inserted into the first extending portions EX1. In the base mode of the display device DD, opposite sides of the support bars SB opposite to each other in the second direction DR2 may respectively be disposed to be inserted into the curved portions CVP, portions of the first extending portions EX1 adjacent to the curved portions CVP, and the second extending portions EX2.

The support bars SB may include a plurality of first support bars SB1, a plurality of second support bars SB2, and a plurality of third support bars SB3. The first support bars SB1 may be arranged horizontally in the first direction DR1 together with the plane of the support plate SPP. The second support bars SB2 may be arranged in a curved shape along the outer surface of the second rotating unit RU2. The third support bars SB3 may be disposed below the first support bars SB1 and arranged horizontally in the first direction DR1.

The first support bars SB1 may be defined as support bars SB disposed in the first extending portions EX1 among the support bars SB. The second support bars SB2 may be defined as support bars SB disposed in the curved portions CVP among the support bars SB. The third support bars SB3 may be defined as support bars SB disposed in the second extending portions EX2 among the support bars SB.

The display module DM may be accommodated in the first and second cases CS1 and CS2 in a folded state along the curved portions CVP according to the disposition of the support part SP described above. For example, a portion of the display module DM on the support bars SB disposed in the curved portions CVP may be folded. A portion of the display module DM disposed on the support plate SPP may be exposed to the outside by the opening OP illustrated in FIG. 1. A portion of the display module DM supported by the support bars SB disposed in the curved portions CVP and the second extending portions EX2 may not be exposed to the outside.

Referring to FIGS. 20 and 22, the first rotating unit RU1 may be disposed below some support bars SB of the support bars SB, and the second rotating unit RU2 may be disposed below some other support bars SB of the support bars SB. For example, the first rotating unit RU1 may be disposed below first support bars SB1 disposed in portions of the first extending portions EX1 adjacent to the curved portions CVP. Further, the first rotating unit RU1 may be disposed on third support bars SB3 disposed in portions of the second extending portions EX2 adjacent to the curved portions CVP.

Projections of the gear part GA may be disposed between first support bars SB1 disposed in the portions of the first extending portions EX1 adjacent to the curved portions CVP. In addition, the projections of the gear part GA may be disposed between third support bars SB3 disposed in the portions of the second extending portions EX2 adjacent to the curved portions CVP.

The second rotating unit RU2 may be adjacent to and disposed to contact the second support bars SB2 disposed in the curved portions CVP. For example, the column part CL of the second rotating unit RU2 may be disposed to contact the second support bars SB2.

When the second support bars SB2 are disposed in the curved portions CVP, a first gap GP1 between lower ends of the second support bars SB2 may be smaller than a second gap GP2 between lower ends of the first and third support bars SB1 and SB3 disposed in the first and second extending portions EX1 and EX2.

Figure 23:
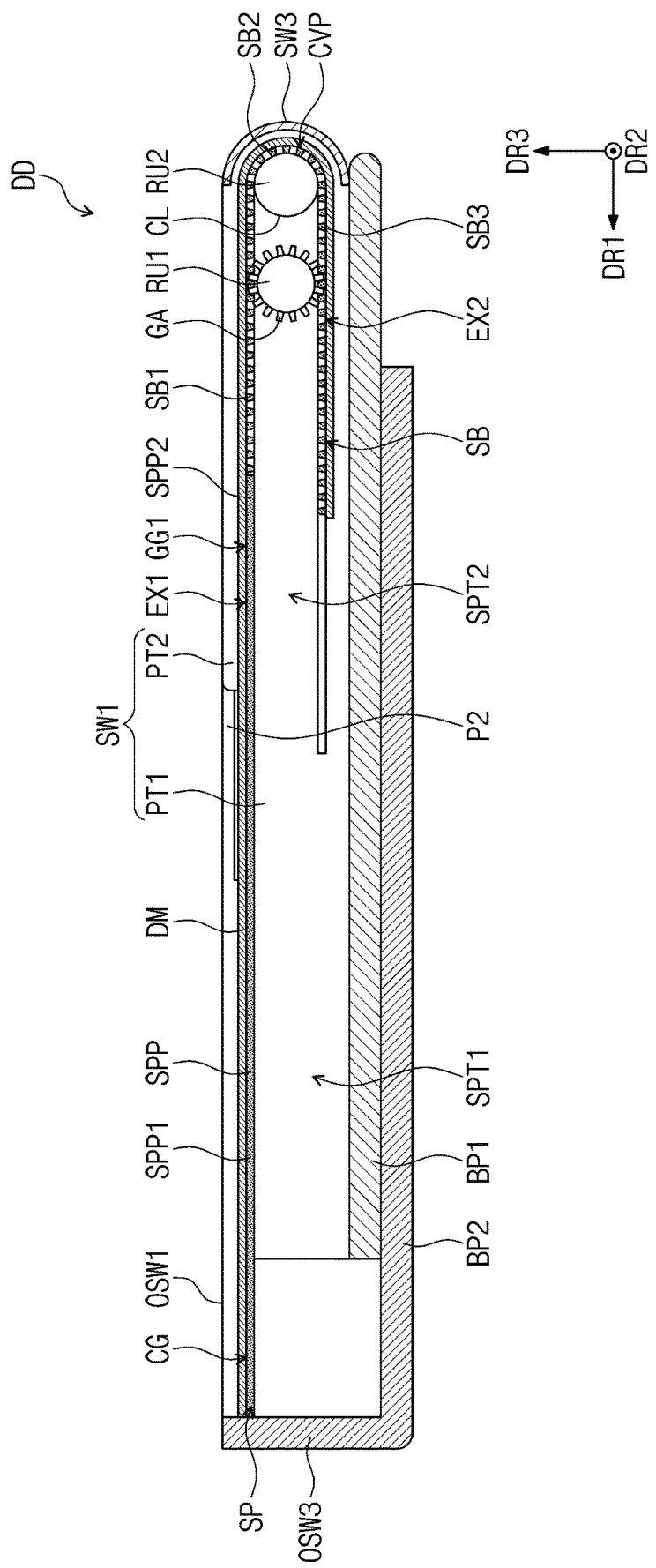
FIG. 23 illustrates the expanded mode of the display device illustrated in FIG. 20.

FIG. 23 illustrates the expanded mode of the display device illustrated in FIG. 20.

Referring to FIG. 23, when the second case CS2 moves in the first direction DR1 so as to be moved away from the first case CS1 for the display device DD to be in the expanded mode, the support part SP may move along the first guide grooves GG1. For example, the first support plate SPP1 may be connected to the second case CS2 to move together with the second case CS2, and the second support plate SPP2 and the support bars SB may move along the first guide grooves GG1. The first and second rotating units RU1 and RU2, while rotating, may easily move the support bars SB along the first guide grooves GG1.

The first and second rotating units RU1 and RU2 may be rotated by the driving unit to move the support bars SB. When the first rotating unit RU1 rotates, the projections of the gear part GA may be disposed between the first support bars SB1 and between the third support bars SB3 to move the first support bars SB1 and the third support bars SB3. The second rotating unit RU2 may rotate at the same speed as the first rotating unit RU1, and may contact the second support bars SB2 to move the second support bars SB2. Accordingly, the support bars SB may be moved more easily by the first and second rotating units RU1 and RU2.

When the first and second rotating units RU1 and RU2 are rotated counterclockwise by the driving unit, the support plate SPP may move in the first direction DR1 according to the movement of the support bars SB and, thus, the second case CS2 may move in the first direction DR1. In this case, the expanded mode of the display device DD may be implemented, as illustrated in FIG. 2. On the contrary, when the first and second rotating units RU1 and RU2 are rotated clockwise by the driving unit, the base mode of the display device DD may be implemented, as illustrated in FIG. 1.

The amount of movement of the second case CS2 may be determined according to the amount of rotation of the first and second rotating units RU1 and RU2. Accordingly, the expanded area of the display module DM may be determined according to the amount of rotation of the first and second rotating units RU1 and RU2. The amount of rotation of the first and second rotating units RU1 and RU2 may be selectively adjusted by a user operating the driving unit. However, embodiments of the inventive concept are not limited thereto, and, in an embodiment, the second case CS2 may be moved by the external force of a user.

When the projections of the gear part GA are disposed between the support bars SB so as to move the support bars SB, abrasion of the projections may occur. The degree of the abrasion of the projections may become larger as the gap between the support bars SB becomes narrower. The abrasion of the projections may increase when the projections of the gear part GA are disposed between the second support bars SB2 of the curved portions CVP spaced apart from each other with the smaller first gap GP1. When the abrasion of the projections of the gear part GA becomes greater, a phenomenon may occur that the projections are not capable of moving the support bars SB, and the gear part GA may rotate without transmitting a force.

However, the abrasion of the projections may be reduced in embodiments of the inventive concept because the projections of the gear part GA are inserted between the first and third support bars SB1 and SB3 of the first and second extending portions EX1 and EX2 spaced apart from each other with the larger second gap GP2.

As a result, the display device DD according to embodiments of the inventive concept may more easily move the support bars SB by using the first and second rotating units RU1 and RU2, and may reduce the abrasion of the projections of the gear part GA.

According to one or more embodiments of the inventive concept, the first and second rotating units disposed adjacent to the support bars supporting the display module may move the support bars easily while rotating at a same speed.

In addition, abrasion of the projections of the gear part may be reduced by disposing the projections of the gear part of the first rotating unit between the support bars disposed in the horizontally extending first extending portions of the first guide grooves, rather than between the support bars disposed in the curved portions of the first guide grooves.

Although some example embodiments of the inventive concept have been described herein, it is to be understood that various changes and modifications may be made by those skilled in the art within the spirit and scope of the inventive concept set forth in the following claims and equivalents thereof. The example embodiments described herein are not intended to limit the technical spirit and scope of the present invention, and all variations and modifications within the spirit and scope of the following claims and equivalents thereof are to be construed as being included in the scope of the present invention.

What is claimed is:

1. A display device comprising: a display module; a support part arranged on a rear surface of the display module and comprising a support plate and a plurality of support bars; a first case configured to accommodate the display module and the support part; a second case coupled to the first case so as to be movable away from or closer to the first case in a first direction; a first rotating unit below some support bars, of the plurality of support bars, arranged horizontally together with the support plate; a second rotating unit below some other support bars of the plurality of support bars, the second rotating unit being spaced apart from the first rotating unit along the first direction; and a belt unit coupling a portion of the first rotating unit and a portion of the second rotating unit adjacent to each other, wherein support bars of the plurality of support bars contact and are supported by surfaces of the first rotating unit and the second rotating unit and are movable according to a rotation of the first rotating unit and the second rotating unit according to the belt unit.

2. The display device of claim 1, wherein the first rotating unit and the second rotating unit extend in a second direction crossing the first direction, and respectively rotate about a central axis of the first rotating unit and a central axis of the second rotating unit that extend parallel to the second direction.

3. The display device of claim 2, wherein the belt unit has a closed curve shape and surrounds the portion of the first rotating unit and the portion of the second rotating unit, and the first rotating unit and the second rotating unit are configured to rotate in a same direction.

4. The display device of claim 1, wherein the plurality of support bars comprises:

a plurality of first support bars arranged horizontally together with the support plate; and
a plurality of second support bars arranged in a curved shape along an outer surface of the second rotating unit,
wherein the first rotating unit is arranged below the plurality of first support bars.

5. The display device of claim 1, wherein opposite sides of the plurality of support bars are respectively inserted into first guide grooves defined on inner surfaces of the first case facing each other in a second direction crossing the first direction, and support bars of the plurality of support bars move along the first guide grooves.

6. A display device comprising:
a display module;
a support part arranged on a rear surface of the display module and comprising a support plate and a plurality of support bars;
a first case configured to accommodate the display module and the support part;
a second case coupled to the first case so as to be movable away from or closer to the first case in a first direction;
a first rotating unit below some support bars, of the plurality of support bars, arranged horizontally together with the support plate;
a second rotating unit below some other support bars of the plurality of support bars; and
belt units each configured to couple a portion of the first rotating unit and a portion of the second rotating unit adjacent to each other,
wherein support bars of the plurality of support bars are supported by surfaces of the first rotating unit and the second rotating unit and are movable according to a rotation of the first rotating unit and the second rotating unit,
wherein opposite sides of the plurality of support bars are respectively inserted into first guide grooves defined on inner surfaces of the first case facing each other in a second direction crossing the first direction, and support bars of the plurality of support bars move along the first guide grooves, and
wherein the first guide grooves comprise:
first extending portions extending in the first direction;
second extending portions extending in the first direction and located below the first extending portions; and
curved portions respectively extending from first sides of the first extending portions to first sides of the second extending portions,
wherein each of the first sides of the first and second extending portions is adjacent to a first side of the first case, and the curved portions have a curved shape convex toward the first side of the first case.

7. The display device of claim 6, wherein the first rotating unit and the second rotating unit are between the first extending portions and the second extending portions.

8. The display device of claim 6, wherein the second rotating unit is between the first rotating unit and the curved portions.

9. The display device of claim 6, wherein the support plate is connected to the second case, support bars of the plurality of support bars extend in the second direction and are arranged in the first direction, and opposite sides of the plurality of support bars are respectively inserted into the curved portions, portions of the first extending portions adjacent to the curved portions, and the second extending portions.

10. The display device of claim 6, wherein the first rotating unit is below a first support bar, of the plurality of support bars, arranged in portions of the first extending portions adjacent to the curved portions, and the second rotating unit is arranged to contact a second support bar, of the plurality of support bars, arranged in the curved portions.

11. The display device of claim 10, wherein the first rotating unit comprises:
   a gear part configured to extend in the second direction; and
   first sub-column parts which extend in the second direction from opposite ends of the gear part, respectively, and have a smaller diameter than the gear part when viewed in the second direction,
   wherein the first support bar is provided in plural, a projection of the gear part is between the plurality of first support bars, and the first sub-column parts are connected to the first case.

12. The display device of claim 11, wherein the second rotating unit comprises:
   a column part configured to extend in the second direction and contact the second support bar arranged in the curved portions; and
   second sub-column parts which extend in the second direction from opposite ends of the column part, respectively, and have a smaller diameter than the column part,
   wherein the second sub-column parts are connected to the first case.

13. The display device of claim 12, wherein the belt units surround the first sub-column parts and the second sub-column parts so as to couple each of the first sub-column parts to a corresponding one of the second sub-column parts.

14. The display device of claim 6, wherein the support plate comprises:
   a first support plate connected to the second case; and
   a second support plate arranged between the first support plate and the plurality of support bars, opposite sides of the second support plate being respectively inserted into the first extending portions,
   wherein a length of the first support plate is greater than a length of the second support plate with respect to the second direction.

15. The display device of claim 14, wherein
   opposite sides of the first support plate are respectively inserted into connection grooves defined on inner surfaces of the second case facing each other in the second direction, and
   the connection grooves do not overlap the first extending portions when viewed in the second direction.

16. The display device of claim 6, wherein the first case comprises:
   a first side wall part extending in the first direction;
   a second side wall part extending in the first direction and facing the first side wall part in the second direction;
   a third side wall part between a side of the first side wall part and a side of the second side wall part and defining the first side of the first case; and
   a first bottom part connected to lower ends of the first, second, and third side wall parts,
   wherein the first guide grooves are respectively defined on an inner surface of the first side wall part and an inner surface of the second side wall part facing each other, and the first and second rotating units are arranged between the first and second side wall parts to be adjacent to the third side wall part.

17. The display device of claim 16, wherein the second case comprises:
   a first outer side wall part on an outer surface of the first side wall part;
   a second outer side wall part on an outer surface of the second side wall part;
   a third outer side wall part facing the third side wall part and arranged between the first outer side wall part and the second outer side wall part; and
   a second bottom part below the first bottom part.

18. The display device of claim 17, wherein the second case further comprises first protrusions protruding respectively from an inner surface of the first outer side wall part and an inner surface of the second outer side wall part facing each other and extending in the first direction,
   wherein the first protrusions are respectively inserted into second guide grooves defined in the outer surface of each of the first side wall part and the second side wall part to extend in the first direction.

19. The display device of claim 17, wherein the second case further comprises second protrusions protruding respectively from an upper end of the first outer side wall part and an upper end of the second outer side wall part toward the first side wall part and the second side wall part and extending in the first direction,
   wherein the second protrusions are respectively inserted into third guide grooves defined in an upper end of each of the first side wall part and the second side wall part to extend in the first direction.

* * * * *